(12) United States Patent
Kim et al.

(10) Patent No.: US 7,471,589 B2
(45) Date of Patent: Dec. 30, 2008

(54) SEMICONDUCTOR MEMORY DEVICES, BLOCK SELECT DECODING CIRCUITS AND METHOD THEREOF

(75) Inventors: Doo-Young Kim, Seongnam-si (KR); Soon-Seob Lee, Seongnam-si (KR); Chul-Soo Kim, Seongnam-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 0 days.

(21) Appl. No.: 11/506,878

(22) Filed: Aug. 21, 2006

(65) Prior Publication Data

US 2007/0047367 A1 Mar. 1, 2007

(30) Foreign Application Priority Data

Aug. 23, 2005 (KR) ............... 10-2005-0077101
Jan. 25, 2006 (KR) ............... 10-2006-0007872

(51) Int. Cl.
*G11C 7/00* (2006.01)
(52) U.S. Cl. .................. 365/230.06; 365/230.01
(58) Field of Classification Search ........... 365/230.06, 365/230.01
See application file for complete search history.

(56) References Cited

U.S. PATENT DOCUMENTS

| | | | | |
|---|---|---|---|---|
| 4,590,838 A | * | 5/1986 | Kashio | 884/631 |
| 5,392,252 A | * | 2/1995 | Rimpo et al. | 365/230.02 |
| 5,691,949 A | * | 11/1997 | Hively et al. | 365/230.03 |
| 6,314,048 B1 | * | 11/2001 | Ishikawa | 365/230.06 |
| 6,381,668 B1 | * | 4/2002 | Lunteren | 711/5 |
| 6,976,083 B1 | * | 12/2005 | Baskey et al. | 709/232 |
| 2003/0167372 A1 | * | 9/2003 | Lee | 711/103 |

FOREIGN PATENT DOCUMENTS

| | | |
|---|---|---|
| JP | 2003-242773 | 8/2003 |
| JP | 2004-062997 | 2/2004 |
| KR | 269526 | 7/2000 |
| KR | 10-2001-0050636 | 6/2001 |
| KR | 10-2001-0093655 | 10/2001 |
| KR | 10-2004-0053911 | 6/2004 |

* cited by examiner

*Primary Examiner*—Michael T Tran
(74) *Attorney, Agent, or Firm*—Harness, Dickey & Pierce, PLC

(57) ABSTRACT

Semiconductor memory devices, block select decoding circuits and a method of activating a word line are provided. An example semiconductor memory device may include a plurality of memory banks. Each of the plurality of memory banks may include memory blocks which may be arranged in different addressable orders. If two edge memory blocks are activated in a given one of the plurality of memory banks, a non-edge memory block may be concurrently activated in at least one of remaining memory banks other than the given one memory bank. Accordingly, a number of concurrently activated memory blocks, a voltage required to enable a word line and noise may be reduced. The example semiconductor device may include the example block select decoding circuit, and likewise may perform the example method of activating a word line with an activation of a reduced number of memory blocks.

24 Claims, 17 Drawing Sheets

FIG. 7

| BANK A | BANK B | BANK C | BANK D | BANK A | BANK B | BANK C | BANK D |
|---|---|---|---|---|---|---|---|
| #0 | #2 | #4 | #6 | #8 | #10 | #12 | #14 |
| #1 | #3 | #5 | #7 | #9 | #11 | #13 | #15 |
| #2 | #4 | #6 | #8 | #10 | #12 | #14 | #16 |
| #N-1 | #0 | #2 | #4 | #6 | #8 | #10 | #12 |
| #N | #1 | #3 | #5 | #7 | #9 | #11 | #13 |
| BANK E | BANK F | BANK G | BANK H | BANK E | BANK F | BANK G | BANK H |
| #16 | #18 | #20 | #22 | #24 | #26 | #28 | #30 |
| #17 | #19 | #21 | #23 | #25 | #27 | #29 | #31 |
| #18 | #20 | #22 | #24 | #26 | #28 | #30 | #32 |
| #14 | #16 | #18 | #20 | #22 | #24 | #26 | #28 |
| #15 | #17 | #19 | #21 | #23 | #25 | #27 | #29 |
| BANK A | BANK B | BANK C | BANK D | BANK A | BANK B | BANK C | BANK D |
| #32 | #34 | #36 | #38 | #40 | #42 | #44 | #46 |
| #33 | #35 | #37 | #39 | #41 | #43 | #45 | #47 |
| #34 | #36 | #38 | #40 | #42 | #44 | #46 | #48 |
| #30 | #32 | #34 | #36 | #38 | #40 | #42 | #44 |
| #31 | #33 | #35 | #37 | #39 | #41 | #43 | #45 |
| BANK E | BANK F | BANK G | BANK H | BANK E | BANK F | BANK G | BANK H |
| #48 | #50 | #52 | #54 | #56 | #58 | #60 | #62 |
| #49 | #51 | #53 | #55 | #57 | #59 | #61 | #63 |
| #50 | #52 | #54 | #56 | #58 | #60 | #62 | #64 |
| #46 | #48 | #50 | #52 | #54 | #56 | #58 | #60 |
| #47 | #49 | #51 | #53 | #55 | #57 | #59 | #61 |

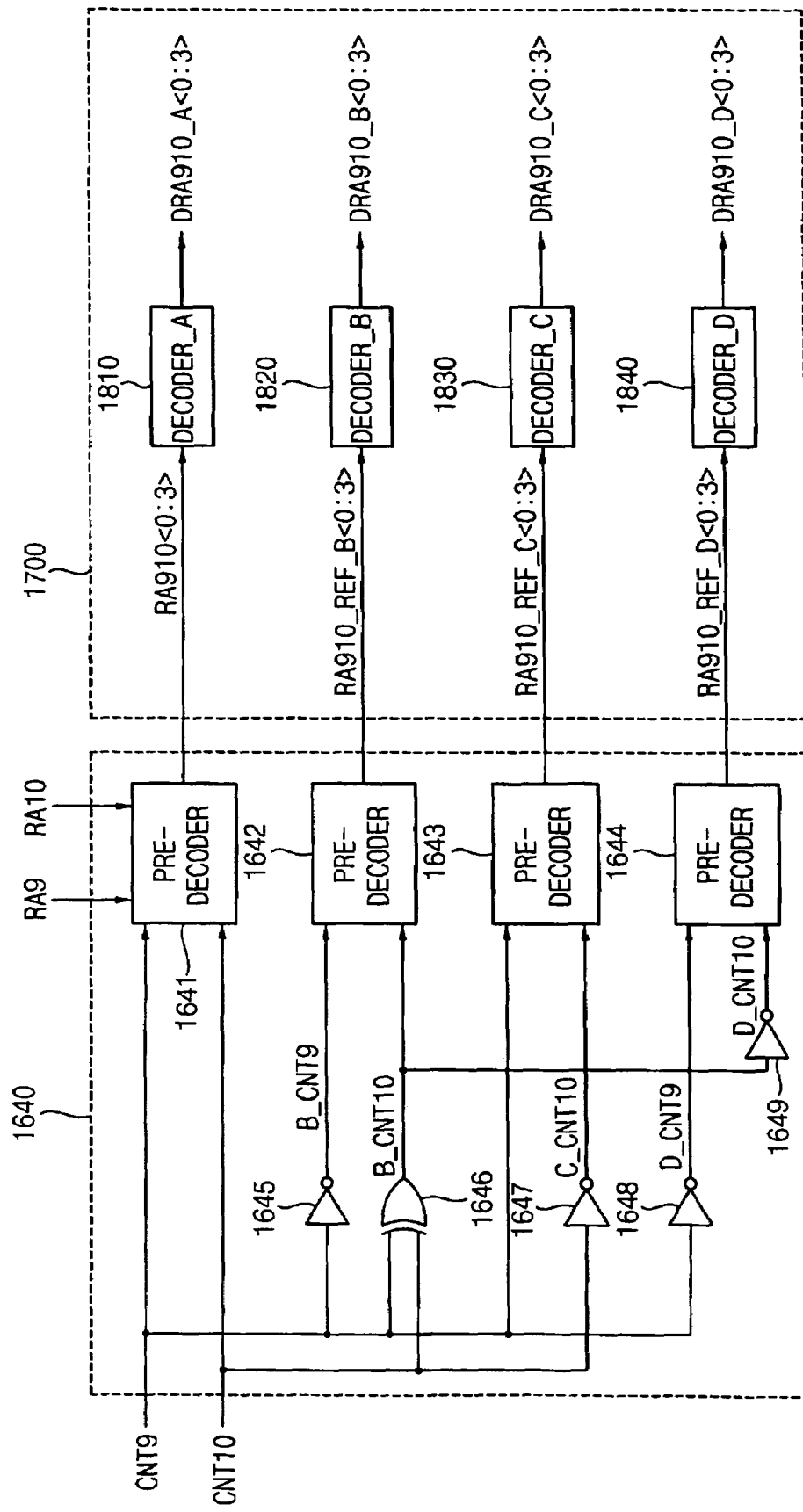

SEMICONDUCTOR MEMORY DEVICES, BLOCK SELECT DECODING CIRCUITS AND METHOD THEREOF

PRIORITY STATEMENT

This application claims priority under 35 USC § 119 to Korean Patent Application No. 2005-77101 and Korean Patent Application No. 2006-7872, filed on Aug. 23, 2005 and Jan. 25, 2006 respectively, the contents of which are herein incorporated by reference in their entirety.

BACKGROUND OF THE INVENTION

1. Field of the Invention

Example embodiments of the present invention relate generally to semiconductor memory devices, block select decoding circuits and a method thereof, and more particularly to semiconductor memory devices, block select decoding circuits and a method of activating a word line.

2. Description of the Related Art

A conventional semiconductor memory device may be used to store data. A number of volatile random access memory (RAM) devices in a computer. A dynamic random access memory (DRAM) may be included among the RAM devices, and may have a plurality of memory cells. A memory cell typically may include a transistor and a capacitor. The capacitor may store an electric charge to represent a first logic level (e.g., a higher logic level or logic "1") or a second logic level (e.g., a lower logic level or logic "0"). Because the electric charge stored in the capacitor may be discharged over time, the capacitor of the memory cell may be periodically refreshed.

The memory cell of the DRAM may be electrically connected to a word line and a bit line. If the transistor of the memory cell is turned on in response to a word line enable signal, data stored in the capacitor may be outputted to the bit line or data on the bit line may be stored in the capacitor as a form of electric charge. Conventional semiconductor memory devices may have a folded bit line architecture or an open bit line architecture.

FIG. 1 is a schematic diagram illustrating a conventional semiconductor memory device with a folded bit line architecture.

Referring to FIG. 1, the semiconductor memory device (e.g., a DRAM device) may include a memory cell array 8 and sense amplifiers 2, 4 and 6. The memory cell array 8 may include a plurality of memory cells that each may include a transistor and a capacitor. Each of the memory cells may be electrically connected to a corresponding word line and a corresponding bit line. The folded bit lines in the folded bit line DRAM device in FIG. 1 may make pairs. Data D0 and D0B on the bit line pair may be amplified by the sense amplifier 2, data D1 and D1B on the bit line pair may be amplified by the sense amplifier 4 and Data D2 and D2B on the bit line pair may be amplified by the sense amplifier 6.

FIG. 2 is a schematic diagram illustrating a conventional semiconductor memory device with an open bit line architecture.

Referring to FIG. 2, the conventional semiconductor memory device (e.g., a DRAM device) may include memory cell arrays 16 and 18 and sense amplifiers 12 and 14. The memory cell array 16 and the memory cell array 18 may be symmetrically disposed respective sides of the sense amplifiers 12 and 14. Data D1 on the bit-line of the memory cell array 16 and data D1B on the bit line of the memory cell array 18, which may be symmetrically disposed to respective sides of the sense amplifier 12, may make a pair and may be complementary to each other. Data D0 on the bit line of the memory cell array 16 and data D0B on the bit line of the memory cell array 18, which may be symmetrically disposed to respective sides of the sense amplifier 14, may make a pair and may be complementary to each other.

FIG. 3 is a conceptual diagram illustrating an edge memory block of a DRAM device with an open bit line architecture.

Referring to FIG. 3, the DRAM device may include memory blocks BLOCK#0, . . . , BLOCK#(N−1), and BLOCK#N and sense amplifiers may be disposed between memory blocks BLOCK#0, . . . , BLOCK#(N−1), and BLOCK#N.

Column lines of the memory blocks BLOCK#0, . . . , BLOCK#(N−1) and BLOCK#N may correspond to word lines and row lines of the memory blocks BLOCK#0, . . . , BLOCK#(N−1) and BLOCK#N may correspond to bit lines. 'VBL' may denote a bit line precharge voltage. For example, the bit line precharge voltage VBL may be one half of a power voltage VDD. The open bit line DRAM device in FIG. 3 may allow a cell area of six times of $F^2$ in which F may denote a distance between two adjacent bit lines, and thus the open bit line architecture in FIG. 3 may be referred to as $6F^2$ architecture.

The bits lines BL and BLB, which may make a pair, may be disposed at left and right sides, respectively, of the sense amplifier in the open bit line DRAM device of FIG. 3. However, the memory blocks BLOCK#0 and BLOCK#N, which may be disposed respectively at left and right boundaries or edges of the memory cell array, may include bit lines that do not make a pair (e.g., bit lines coupled to unpaired memory cells indicated with dark-colored circles in FIG. 3). The unpaired memory cells may not be coupled to the sense amplifier, and instead may be dummy cells that may not be configured to store data.

A bit line in the memory block BLOCK#0 may make a pair (e.g., bit lines coupled to memory cells indicated with white-colored circles in FIG. 3) with a bit line in the memory block BLOCK#1. Therefore, word lines of the edge memory block BLOCK#0 disposed at the left edge of the memory cell array and word lines of the edge memory block BLOCK#N disposed at the right edge of the memory cell array may be concurrently activated.

FIG. 4 is a schematic view illustrating a DRAM device having a plurality of memory banks.

Referring to FIG. 4, the semiconductor memory device may include four memory banks BANK A, BANK B, BANK C and BANK D. Each of the memory banks BANK A, BANK B, BANK C and BANK D may include N+1 memory blocks BLOCK#0 through BLOCK#N.

FIG. 5 is a conceptual diagram illustrating an activation of a word line within the DRAM device in FIG. 4. Hereinafter, an activation of word lines in a memory block may be, for the sake of brevity, referred to as an activation of the respective memory block itself.

In the DRAM device in FIG. 5, the memory blocks of the respective memory banks BANK A, BANK B, BANK C and BANK D may have identical or corresponding addresses, such as BLOCK#0 through BLOCK#N. The two memory blocks BLOCK#0 and BLOCK#N may be edge memory blocks and the other memory blocks (e.g., other than the edge memory blocks) may be referred to as "normal" (i.e., non-edge) memory blocks BLOCK#1 through BLOCK#N−1.

Referring to FIG. 5, the edge memory blocks BLOCK#0 and BLOCK#N, which may be disposed on both edges of the respective memory banks, may be concurrently activated (e.g., indicated with solid lines), and the normal memory blocks may be activated independently (e.g., indicated with dashed lines). In FIG. 5, the memory block BLOCK#2 may be representative of a normal memory block that may be activated.

Each of the plurality of memory banks BANK A, BANK B, BANK C and BANK D may be concurrently activated in a refresh mode. However, if word lines in the edge memory blocks of all the memory banks are concurrently activated, a higher word line enable voltage VPP may be required, which may increase power consumption as well as circuit noise in a conventional semiconductor memory device having a plurality of memory banks.

Generally, only one of the "normal" memory blocks may be activated at a given time, while two word lines in the edge memory block may be activated at a given time. Therefore, in the semiconductor memory device in FIG. 5, a ratio of a number of concurrently activated word lines with only the normal memory blocks activated (e.g., in all of the memory banks) to a number of concurrently activated word lines when edge memory blocks are activated may be 1:2.

Accordingly, if the word lines of the semiconductor memory device having a plurality of memory banks are activated, the concurrent activation of the edge memory blocks BLOCK#0 and BLOCK#N for two or more memory banks may cause an increase in a word line enable voltage VPP, thereby generating an increased amount of noise.

SUMMARY OF THE INVENTION

An example embodiment of the present invention is directed to a semiconductor memory device, including a plurality of memory banks, each of the plurality of memory banks including a plurality of memory blocks, the plurality of memory blocks arranged in a different addressable order in each of the plurality of memory banks such that memory blocks in corresponding positions of different memory banks do not have the same address.

Another example embodiment of the present invention is directed to a semiconductor memory device, including a memory bank having at least one normal memory block and at least two edge memory blocks, the at least two edge memory blocks having different addressable orders, the at least two edge memory blocks positioned on different edges of the memory bank and the at least one normal memory block not positioned on an edge of the memory bank.

Another example embodiment of the present invention is directed to a method of activating a word line of a semiconductor memory device including a plurality of memory banks, each of the plurality of memory banks including a plurality of memory blocks, including assigning different addresses to corresponding memory blocks in different memory banks, the addresses being assigned to each memory block based on which memory bank includes the memory block.

Another example embodiment of the present invention is directed to a semiconductor memory device, including a plurality of memory banks, each of the memory banks having a plurality of memory blocks, wherein two edge memory blocks are activated in a given one of the plurality of memory banks and at least one normal memory block is activated in each of the plurality of memory banks other than the given one memory bank, the two edge memory blocks positioned on different edges of the given one memory bank and each of the at least one memory blocks not positioned on an edge of the plurality of memory banks other than the given one memory bank.

Another example embodiment of the present invention is directed to a block select decoding circuit, including a plurality of decoders, each of the plurality of decoders configured to decode pre-decoded row address signals in response to an active mode enable signal to generate decoded row address signals for an associated memory bank, each of the plurality of decoders associated with a different memory bank.

Another example embodiment of the present invention is directed to a block select decoding circuit, including a pre-decoder circuit configured to generate a pre-decoded row address signal for each of a plurality of memory banks in response to a row address signal, a first refresh count signal and a second refresh count signal, the row address signal including block select information, each of the row address signals for respective members of the plurality of memory banks being different from one another and a decoder circuit configured to decode the row address signals to generate a plurality of decoded row address signals, each of the decoded row address signals for the respective members of the plurality of memory banks being different from one another.

Another example embodiment of the present invention is directed to a semiconductor memory device capable of reducing a word line enable voltage by reducing a number of concurrently activated word lines.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 7 is a schematic view illustrating a semiconductor memory device according to another example embodiment of the present invention.

FIG. 18 is a block diagram illustrating a pre-decoder and a second address buffer included within the word line control signal generating circuit of FIG. 9 according to another example embodiment of the present invention.

DETAILED DESCRIPTION OF EXAMPLE EMBODIMENTS OF THE PRESENT INVENTION

Figure 1:
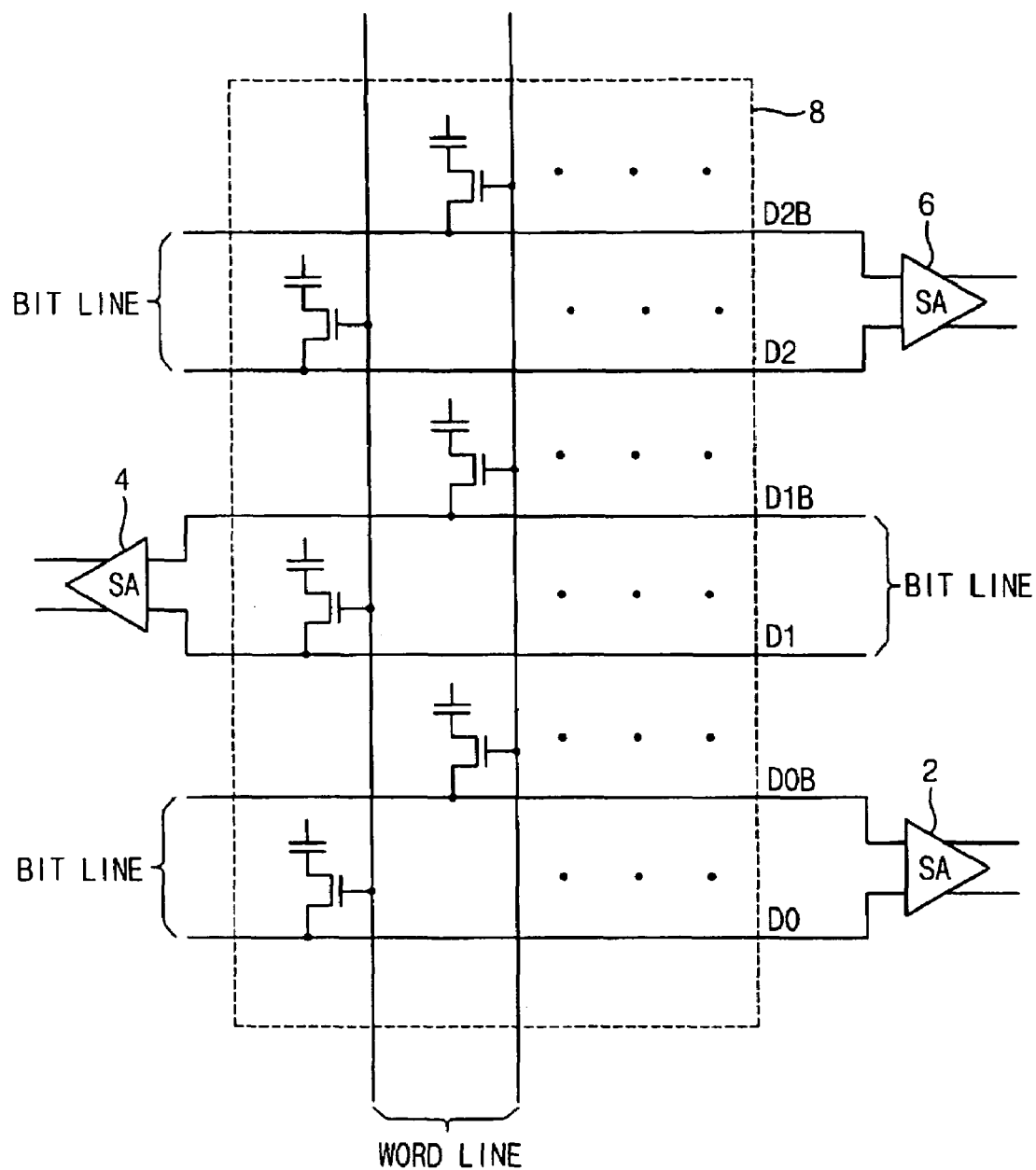
FIG. 1 is a schematic diagram illustrating a conventional semiconductor memory device with a folded bit line architecture.
Figure 2:
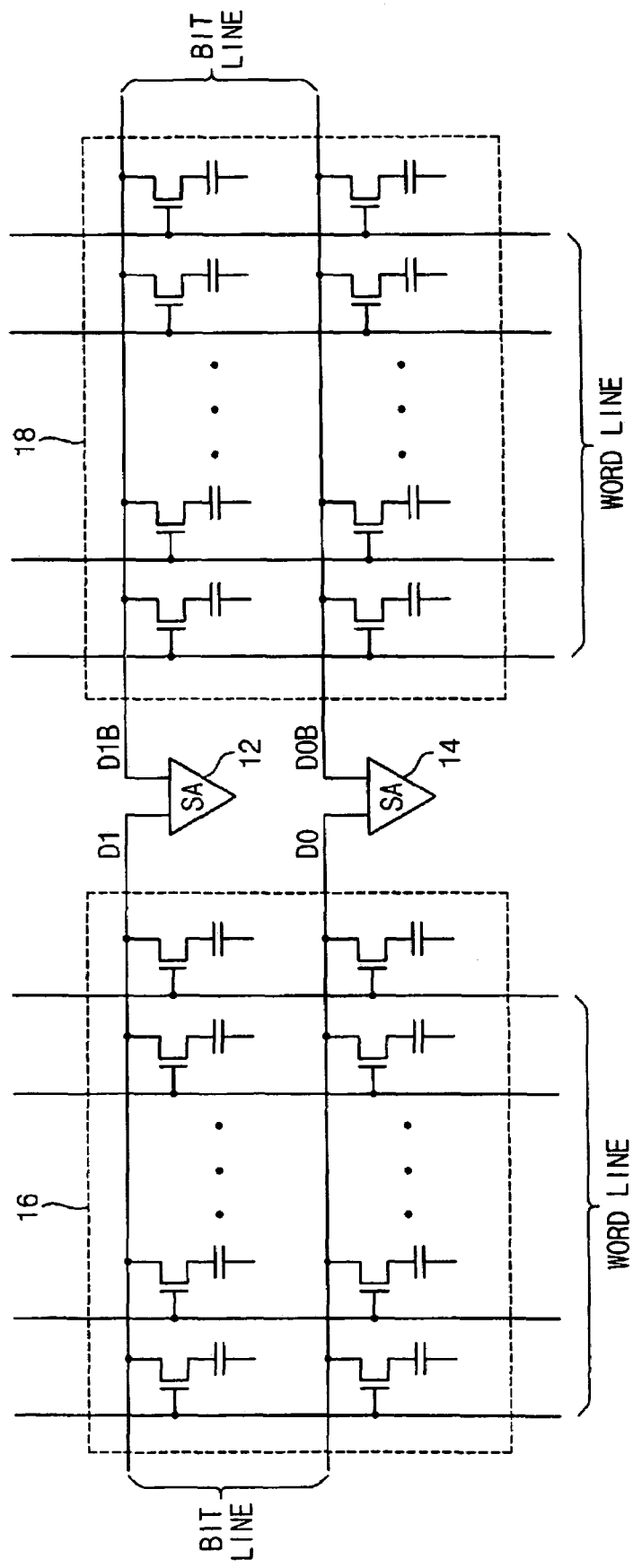
FIG. 2 is a schematic diagram illustrating a conventional semiconductor memory device with an open bit line architecture.
Figure 3:
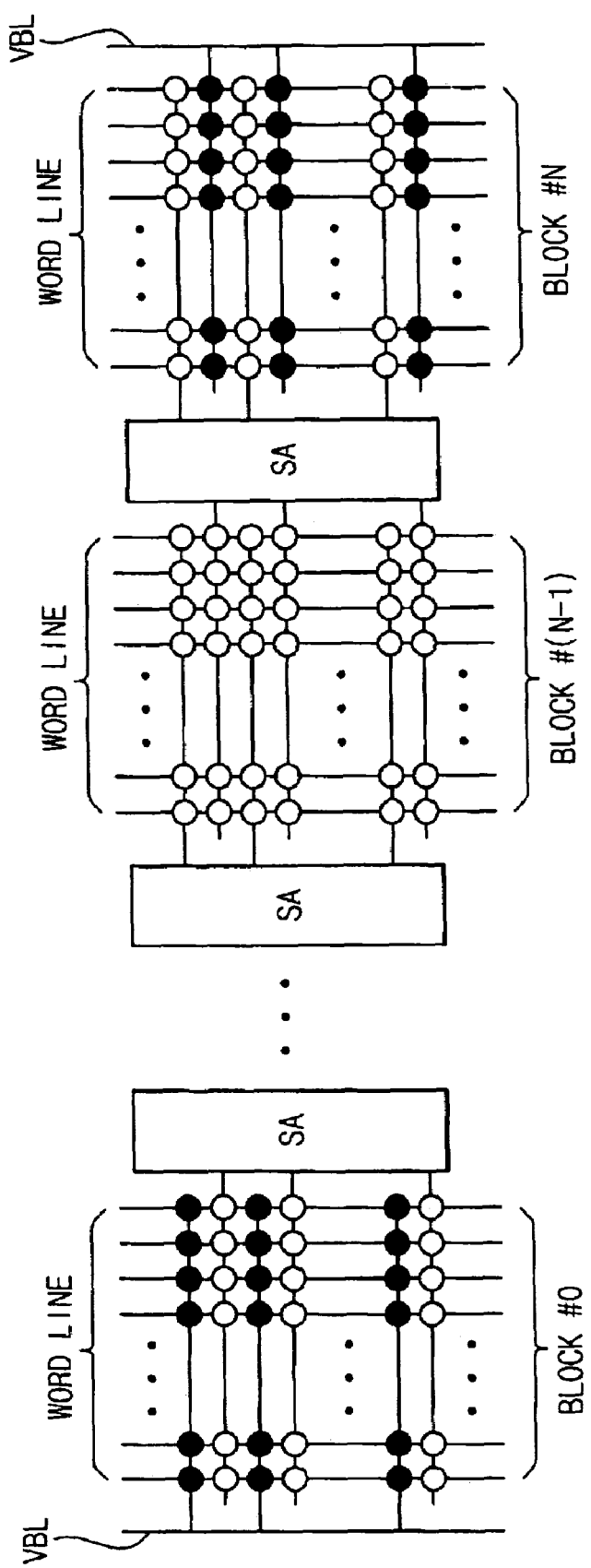
FIG. 3 is a conceptual diagram illustrating an edge memory block of a dynamic random access memory (DRAM) device with an open bit line architecture.
Figure 4:
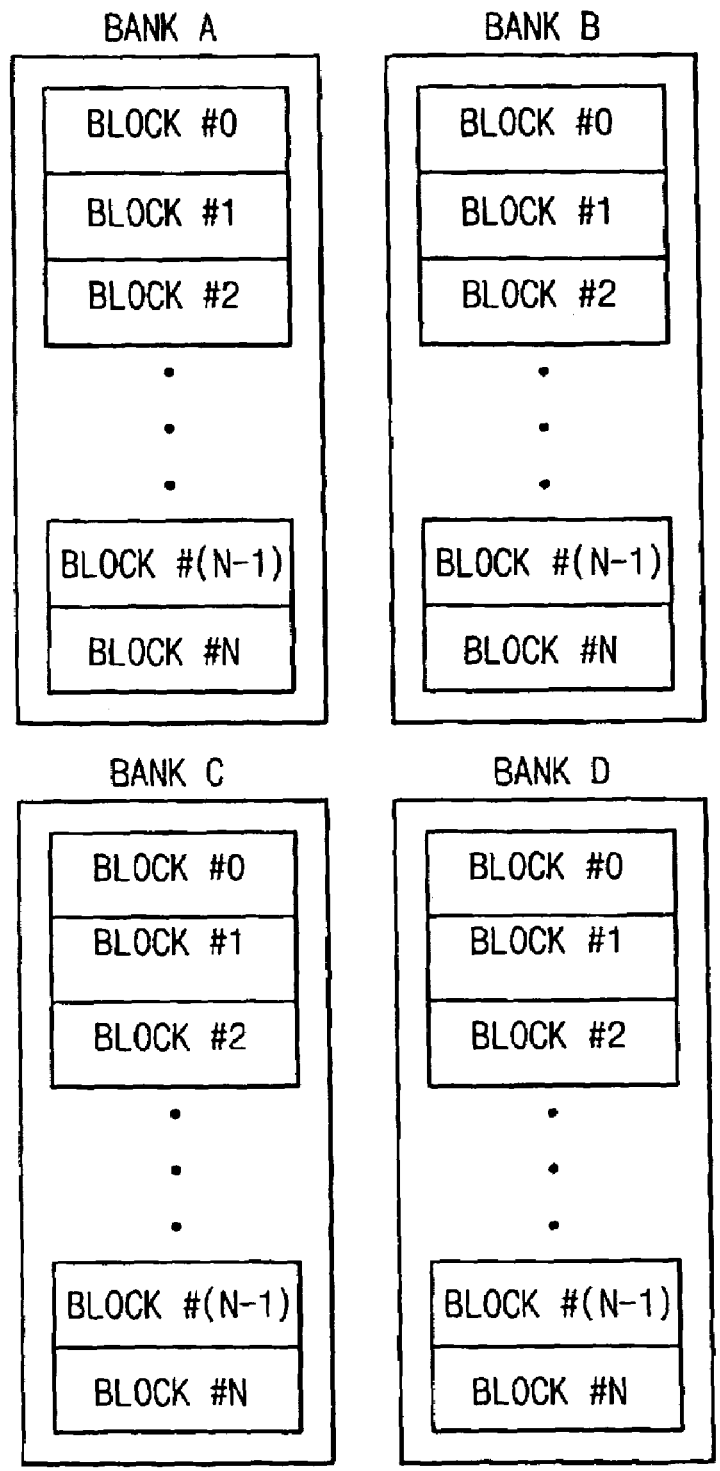
FIG. 4 is a schematic view illustrating a DRAM device having a plurality of memory banks.

Example embodiments of the present invention are described more fully hereinafter with reference to the accompanying drawings, in which example embodiments of the present invention are shown. Example embodiments of the present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a memory block disposed on an edge of respective memory banks may be referred to as an edge memory block and a memory block disposed "inside" or "within" the respective edge memory blocks may be referred to as a normal edge block. A word line pertaining to the edge memory block may be referred to as an edge word line and a word line pertaining to the normal memory block may be referred to as a normal word line.

Figure 6:
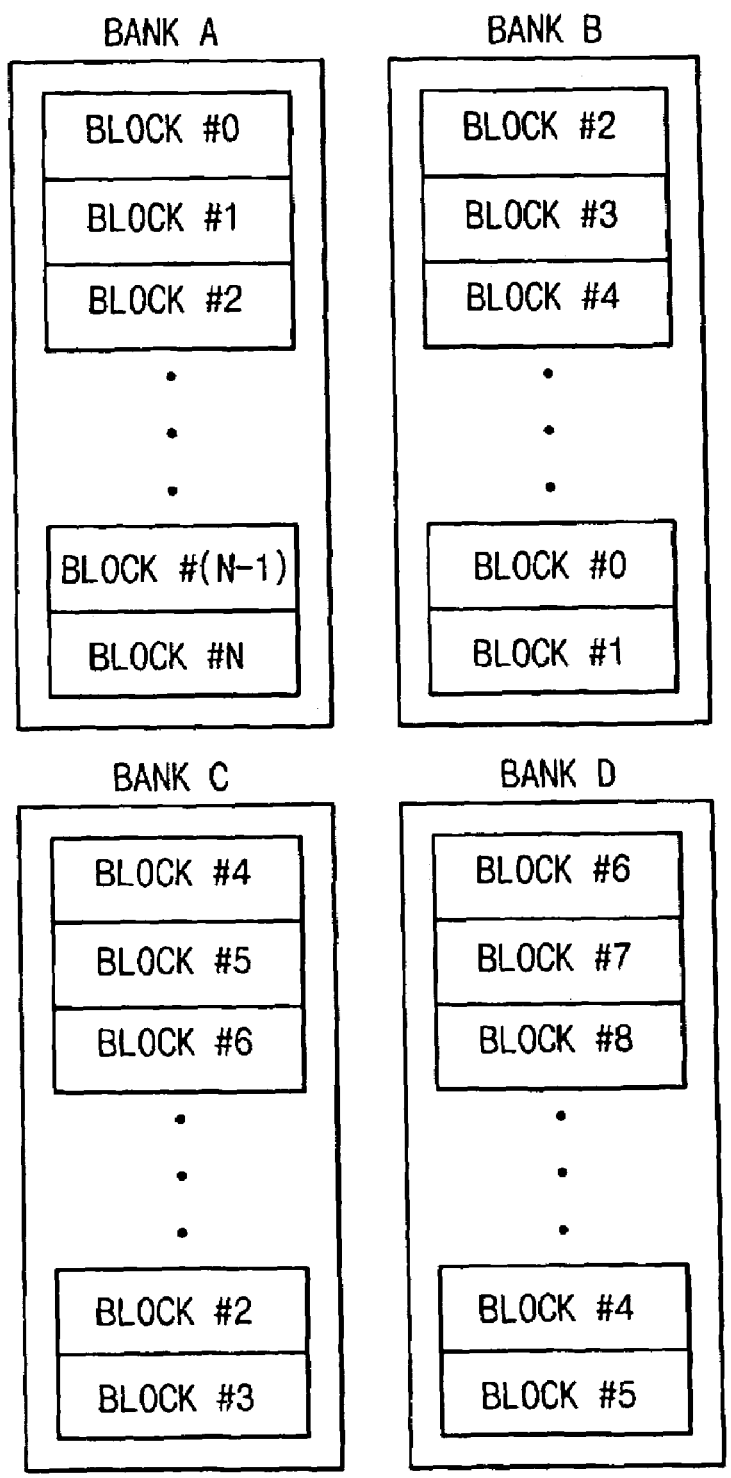
FIG. 6 is a schematic view illustrating a semiconductor memory device according to an example embodiment of the present invention.

FIG. 6 is a schematic view illustrating a semiconductor memory device according to an example embodiment of the present invention. The semiconductor memory device of FIG. 6 will be described hereinafter as a dynamic random access memory (DRAM) device. However, it will be understood that the semiconductor memory device need not be a DRAM device in other example embodiments of the present invention.

In the example embodiment of FIG. 6, the DRAM device may include four memory banks BANK A, BANK B, BANK C and BANK D. The respective memory banks BANK A, BANK B, BANK C and BANK D may each include N+1 memory blocks BLOCK#0 through BLOCK#N. While described below with respect to four memory banks, it is understood that other example embodiments may be directed to a DRAM device (e.g., or other semiconductor memory device type) with any number of memory banks.

In the example embodiment of FIG. 6, the memory banks BANK A, BANK B, BANK C and BANK D may have different addresses for corresponding memory blocks, which may be referred to as different "addressable orders" of memory blocks. For example, with respect to the memory bank BANK A, memory blocks may be arranged in order of BLOCK#0, BLOCK#1, BLOCK#2, . . . , BLOCK#(N−1) and BLOCK#N. With respect to the memory bank B, memory blocks may be arranged in order of BLOCK#2, BLOCK#3, BLOCK#4, . . . , BLOCK#N, BLOCK#0 and BLOCK#1. With respect to the memory bank BANK C, memory blocks may be arranged in order of BLOCK#4, BLOCK#5, BLOCK#6, . . . , BLOCK#N, BLOCK#1, BLOCK#2 and BLOCK#3. With respect to the memory bank D, memory blocks may be arranged in order of BLOCK#6, BLOCK#7, BLOCK#8, . . . , BLOCK#N, BLOCK#1, . . . , BLOCK#4 and BLOCK#5. Thus, the memory blocks of the respective memory banks of the DRAM device in FIG. 6 may have different respective addressable orders. Therefore, although the edge memory blocks BLOCK#0 and BLOCK#N of the memory bank BANK A may be activated, the memory blocks BLOCK#0 and BLOCK#N of the memory banks BANK B, BANK C and BANK D may not necessarily correspond to edge memory blocks, and thus both memory blocks BLOCK#0 and BLOCK#N within the memory banks BANK B, BANK C and BANK D may not be concurrently activated.

Figure 5:
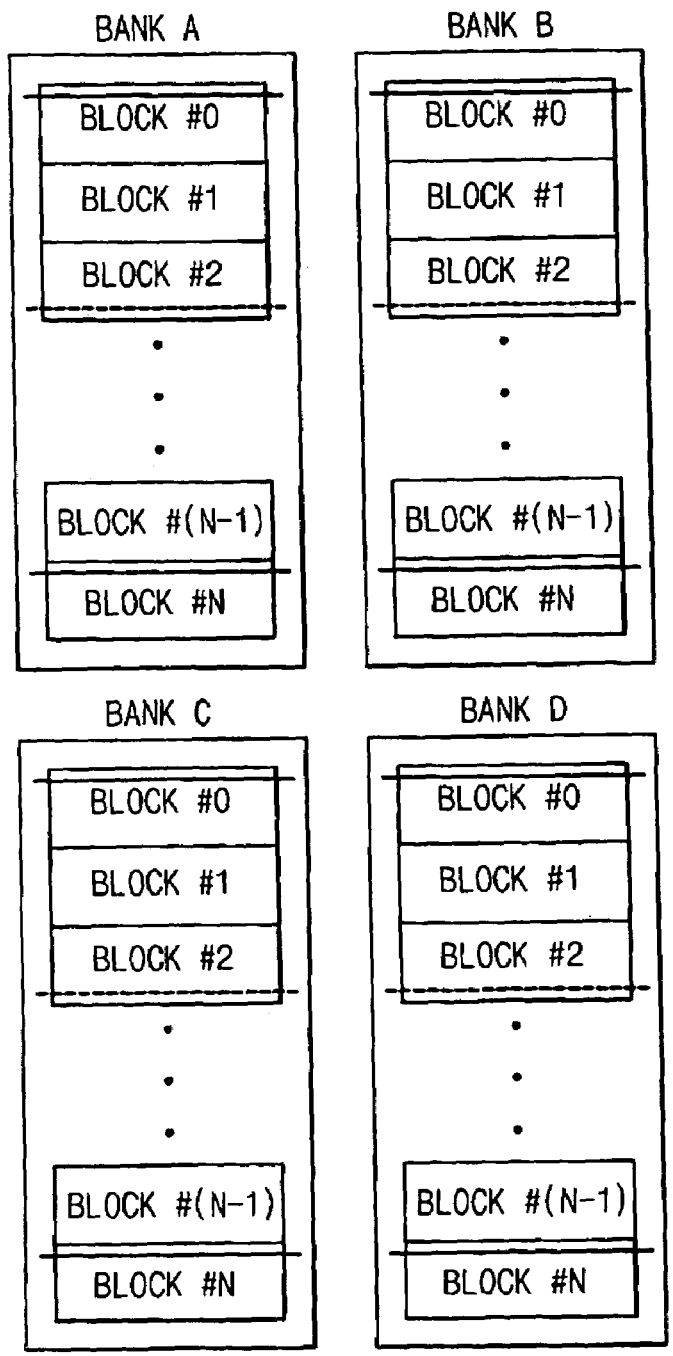
FIG. 5 is a conceptual diagram illustrating an activation of a word line within the DRAM device in FIG. 4.

In the example embodiment of FIG. 6, if the memory blocks are arranged as illustrated in FIG. 6, two edge memory blocks may be activated in a single memory bank among the four memory banks, and only the normal memory blocks may be activated in the remaining three memory banks. Therefore, a ratio of a number of concurrently activated word lines if only the normal memory blocks are activated for all the memory banks to a number of concurrently activated word lines if edge memory blocks are activated for some memory banks may be 4:5, or 1:1.2 (e.g., as opposed to 1:2 in the conventional art). Therefore, if the memory blocks are arranged as illustrated in FIG. 6, the number of word lines that may be activated may be reduced compared with the conventional DRAM device in FIG. 5, thereby decreasing an amount of generated noise.

FIG. 7 is a schematic view illustrating a semiconductor memory device according to another example embodiment of the present invention. The semiconductor memory device of FIG. 7 will be described hereinafter as a DRAM device. However, it will be understood that the semiconductor memory device need not be a DRAM device in other example embodiments of the present invention.

In the example embodiment of FIG. 7, the DRAM device may include four memory bank groups. First through fourth memory bank groups may each include memory banks BANK A, BANK B, BANK C, BANK D, BANK E, BANK F, BANK G and BANK H.

In the example embodiment of FIG. 7, the first memory bank group may include first through eighth memory banks BANK A, BANK B, BANK C, BANK D, BANK E, BANK F, BANK G and BANK H. The first memory bank may include memory blocks with block addresses 0, 1, 2, . . . , N−1 and N. The second memory bank may include memory blocks with block addresses in order of 2, 3, 4, . . . , 0 and 1. The third memory bank may include memory blocks with block addresses in order of 4, 5, 6, . . . , 2 and 3. The fourth memory bank may include memory blocks with block addresses in order of 6, 7, 8, . . . , 4 and 5. The fifth memory bank may include memory blocks with block addresses in order of 16, 17, 18, . . . , 14 and 15. The sixth memory bank may include memory blocks with block addresses in order of 18, 19, 20, . . . , 16 and 17. The seventh memory bank may include memory blocks with block addresses in order of 20, 21, 22, . . . , 18 and 19. The eighth memory bank may include memory blocks with block addresses in order of 22, 23, 24, . . . , 20 and 21.

In the example embodiment of FIG. 7, the second memory bank group may include ninth through sixteenth memory banks BANK A through BANK H. The ninth memory bank may include memory blocks with block addresses in order of 8, 9, 10, . . . , 6 and 7. The tenth memory bank may include memory blocks with block addresses in order of 10, 11, 12, . . . , 8 and 9. The eleventh memory bank may include memory blocks with block addresses in order of 12, 13, 14, . . . , 10 and 11. The twelfth memory bank may include memory blocks with block addresses in order of 14, 15, 16, . . . , 12 and 13. The thirteenth memory bank may include memory blocks with block addresses in order of 24, 25, 26, . . . , 22 and 23. The fourteenth memory bank may include memory blocks with block addresses in order of 26, 27, 28, . . . , 24 and 25. The fifteenth memory bank may include memory blocks with block addresses in order of 28, 29, 30, . . . , 26 and 27. The sixteenth memory bank may include memory blocks with block addresses in order of 30, 31, 32, . . . , 28 and 29.

In the example embodiment of FIG. 7, the third memory bank group may include seventeenth through twenty-fourth memory banks BANK A through BANK H. The seventeenth memory bank may include memory blocks with block addresses in order of 32, 33, 34, . . . , 30 and 31. The eighteenth memory bank may include memory blocks with block addresses in order of 34, 35, 36, . . . , 32 and 33. The nineteenth memory bank may include memory blocks with block addresses in order of 36, 37, 38, . . . , 34 and 35. The twentieth memory bank may include memory blocks with block addresses in order of 38, 39, 40, . . . , 36 and 37. The twenty-first memory bank may include memory blocks with block addresses in order of 48, 49, 50, . . . , 46 and 67. The twenty-second memory bank may include memory blocks with block addresses in order of 50, 51, 52, . . . , 48 and 49. The twenty-third memory bank may include memory blocks with block addresses in order of 52, 53, 54, . . . , 50 and 51. The twenty-fourth memory bank may include memory blocks with block addresses in order of 54, 55, 56, . . . ,52 and 53.

In the example embodiment of FIG. 7, the fourth memory bank group may include twenty-fifth through thirty-second memory banks BANK A through BANK H. The twenty-fifth memory bank may include memory blocks with block addresses in order of 40, 41, 42, . . . , 38 and 39. The twenty-sixth memory bank may include memory blocks with block addresses in order of 42, 43, 44, . . . , 40 and 41. The twenty-seventh memory bank may include memory blocks with block addresses in order of 44, 45, 46, . . . , 42 and 43. The twenty-eighth memory bank may include memory blocks with block addresses in order of 46, 47, 48, . . . , 44 and 45. The twenty-ninth memory bank may include memory blocks with block addresses in order of 56, 57, 58, . . . , 54 and 55. The thirty memory bank may include memory blocks with block addresses in order of 58, 59, 60, . . . , 56 and 57. The thirty-first memory bank may include memory blocks with block addresses in order of 60, 61, 62, . . . , 58 and 59. The thirty-second memory bank may include memory blocks with block addresses in order of 62, 63, 64, ..., 60 and 61.

In the example embodiment of FIG. 7, as discussed in detail above, the memory blocks of the respective memory banks may each have different addresses from one another. Thus, although the edge memory blocks BLOCK#0 and BLOCK#N of the first memory bank may be activated, the memory blocks BLOCK#0 and BLOCK#N of other memory banks (e.g., second through thirty-second memory banks), which may not necessarily correspond to edge memory blocks of the other memory banks, and may not be activated. Accordingly, both memory blocks BLOCK#0 and BLOCK#N of the respective memory banks may not be concurrently activated because the edge memory blocks of the respective memory banks may not be aligned.

In the example embodiment of FIG. 7, in an example, if the memory blocks are arranged with an addressing scheme as illustrated in FIG. 7, two edge memory blocks may be activated in only one memory bank, and only the normal memory blocks may be activated in the remaining memory banks.

In the example embodiment of FIG. 7, if the semiconductor memory device operates in a refresh mode and one normal word line is respectively activated in the four memory banks among the eight memory banks per memory bank group, the number of word lines that may be concurrently activated in the four memory bank group may be 16 (e.g., 4 bank groups times 4 banks). However, it is understood that other example embodiments of the invention may be directed to semiconductor memory devices having any number of bank groups and banks, and thereby, a different number of concurrently activated word lines.

Referring again to the conventional semiconductor memory device wherein all edge blocks may be concurrently activated, a ratio of a number of concurrently activated word lines in the four memory bank group if only the normal memory blocks are activated to a number of concurrently activated word lines in the four memory bank group when edge memory blocks is 16:32, which may be alternatively expressed as 1:2. However, in the example embodiment of FIG. 7, the ratio may be reduced to 16:17, which may be alternatively expressed as 1:1.06. The ratio reduction may likewise decrease an amount of generated noise.

Figure 8:
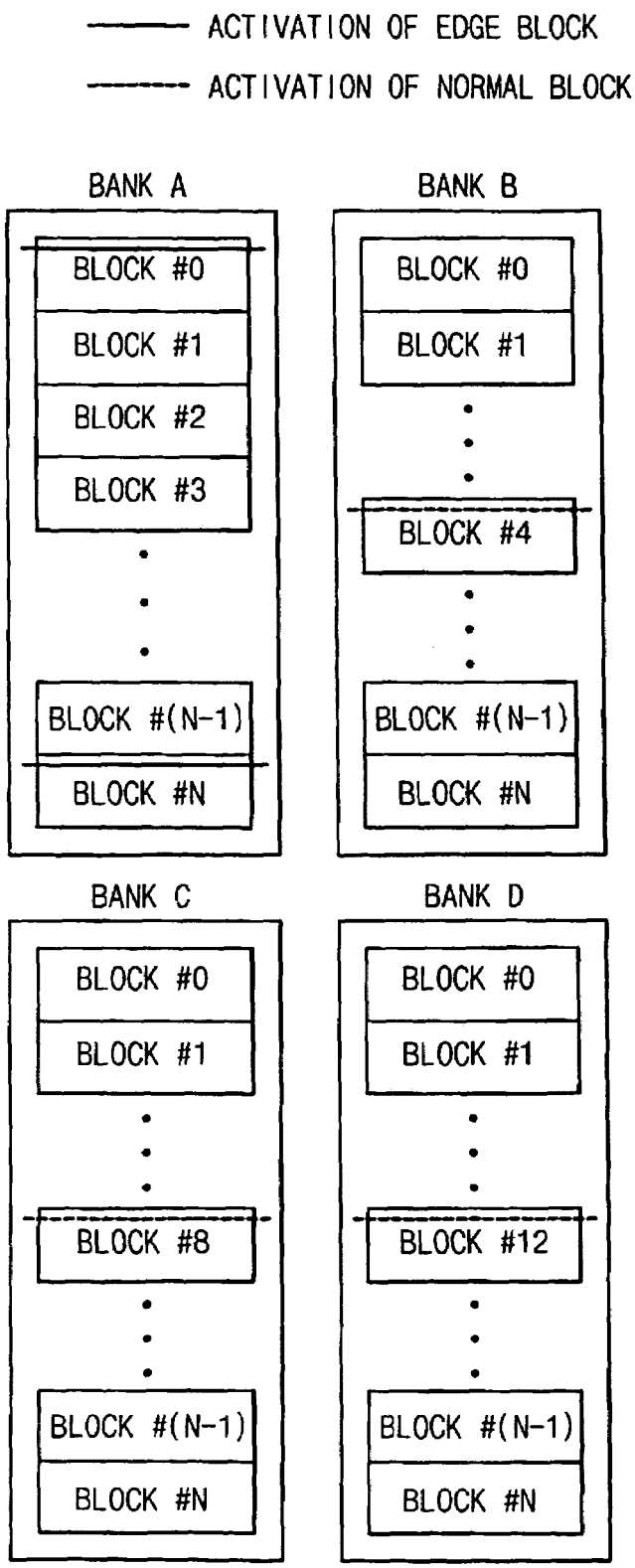
FIG. 8 is a conceptual diagram illustrating a semiconductor memory device according to another example embodiment of the present invention.

FIG. 8 is a conceptual diagram illustrating a semiconductor memory device according to another example embodiment of the present invention.

In the example embodiment of FIG. 8, the semiconductor memory device may include memory blocks within respective memory banks BANK A, BANK B, BANK C and BANK D, with the memory blocks having identical addresses, such as BLOCK#0 through BLOCK#N. In contrast to the example embodiments of FIGS. 6 and 7, the memory blocks BLOCK#0 and BLOCK#N may be edge memory blocks for each of the memory banks BANK A, BANK B, BANK C and BANK D, and the remaining memory blocks may be normal memory blocks.

In the example embodiment of FIG. 8, in an example, if edge memory blocks BLOCK#0 and BLOCK#N of the memory bank BANK A are activated, a normal memory block BLOCK#4 of the memory bank BANK B, a normal memory block BLOCK#8 of the memory bank BANK C and a normal memory block BLOCK#12 of the memory bank BANK D may be activated. In this example, concurrently activated edge memory blocks among the plurality of memory banks may be reduced or prevented with word line control signals (e.g., which may be generated depending on respective memory banks).

Figure 9:
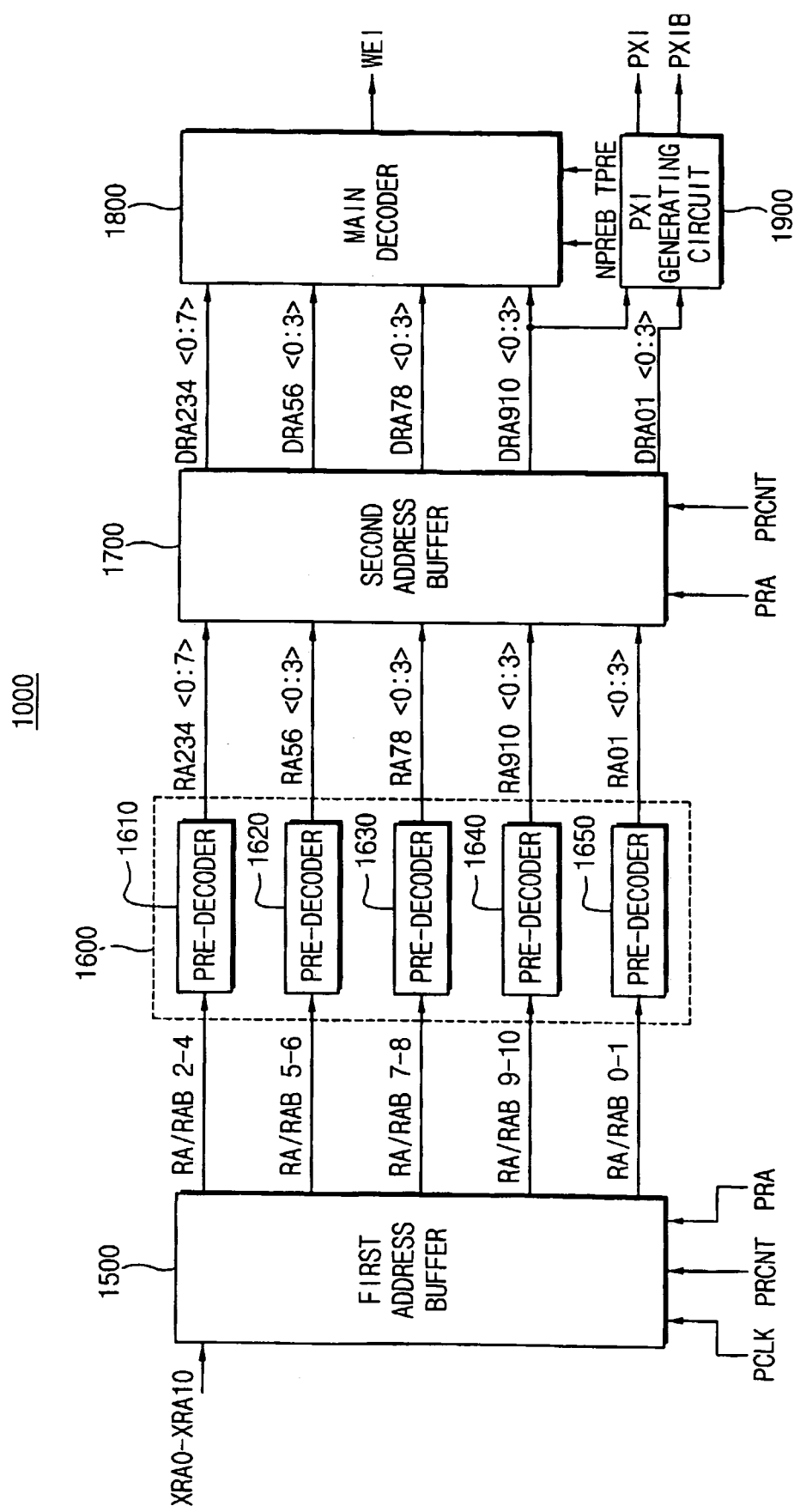
FIG. 9 is a block diagram illustrating a word line control signal generating circuit according to another example embodiment of the present invention.

FIG. 9 is a block diagram illustrating a word line control signal generating circuit 1000 according to another example embodiment of the present invention.

In the example embodiment of FIG. 9, the word line control signal generating circuit 1000 may include a first address buffer 1500, a pre-decoder unit 1600, a second address buffer 1700, a main decoder 1800 and a word line boosting signal generating circuit 1900. The word line control signal may include a word line enable signal WEI and a word line boosting signal pair PXI and PXIB.

In the example embodiment of FIG. 9, the first address buffer 1500 may latch external address signals XRA0 through XRA10, which may be successively received from an external source, to generate corresponding row address signals RA/RAB2-4, RA/RAB5-6, RA/RAB7-8, RA/RAB9-10 and RA/RAB0-1 in response to an internal clock signal PCLK, a row address setup signal PRA and a refresh count signal PRCNT. In an example, the 7-bit XRA2-XRA8 of the external address signals XRA0-XRA10 may be used to designate one of 128 main decoders and 2-bit XRA9-XRA10 may be used to designate one of four memory blocks and 2-bit XRA0-XRA1 may be used to designate one of four sub word line drivers. It is understood that the above-described addresses, bit-lengths and number of decoders may scale to any number in other example embodiments of the present invention.

In the example embodiment of FIG. 9, the pre-decoder unit 1600 may include pre-decoders 1610, 1620, 1630, 1640 and 1650. The pre-decoders 1610, 1620, 1630, 1640 and 1650 may perform decoding on the row address signals RA/RAB2-4, RA/RAB5-6, RA/RAB7-8, RA/RAB9-10 and RA/RAB0-1, respectively, to generate pre-decoded row address signals RA234_i (i=0~7), RA56_i (i=0~3), RA78_i (i=0~3), RA910_i (i=0~3) and RA01_i (i=0~3), respectively. The pre-decoder 1640 may be a block select pre-decoder that controls the second address buffer 1700 to generate a block select signal DRA910_I for selecting a memory block.

In the example embodiment of FIG. 9, the second address buffer 1700 may latch the pre-decoded row address signals RA234_i, RA56_i, RA78_i, RA910_i and RA01_i received from the pre-decoder unit 1600 in response to the row address setup signal PRA and the refresh count signal PRCNT to generate coded row address signals DRA234_i (i=0~7), DRA56_i (i=0~3), DRA78_i (i=0~3), DRA910_i (i=0~3) and DRA01_i (i=0~3), respectively.

In the example embodiment of FIG. 9, the main decoder 1800 may receive the coded row address signals DRA234_i (i=0~7), DRA56_i (i=0~3), DRA78_i (i=0~3), DRA910_i (i=0~3) and DRA01_i (i=0~3) and precharge control signals NPREB and TPRE. The main decoder 1800 may generate 128 word line enable signals WEI. The decoded row address signal DRA910_i may function as a block select signal for selecting a memory block.

In the example embodiment of FIG. 9, the word line boosting signal generating circuit 1900 may generate a word line boosting signal pair PXI and PXIB in response to the decoded row address signals DRA910_i and DRA01_i.

Figure 10:
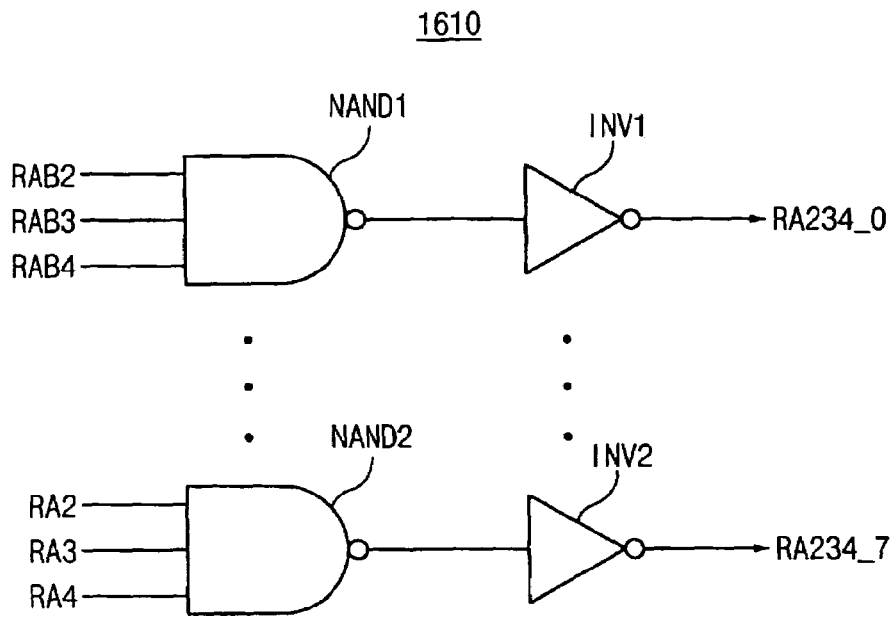
FIGS. 10 and 11 are schematic views illustrating pre-decoders of the word line control signal generating circuit of FIG. 9 according to another example embodiment of the present invention.
Figure 11:
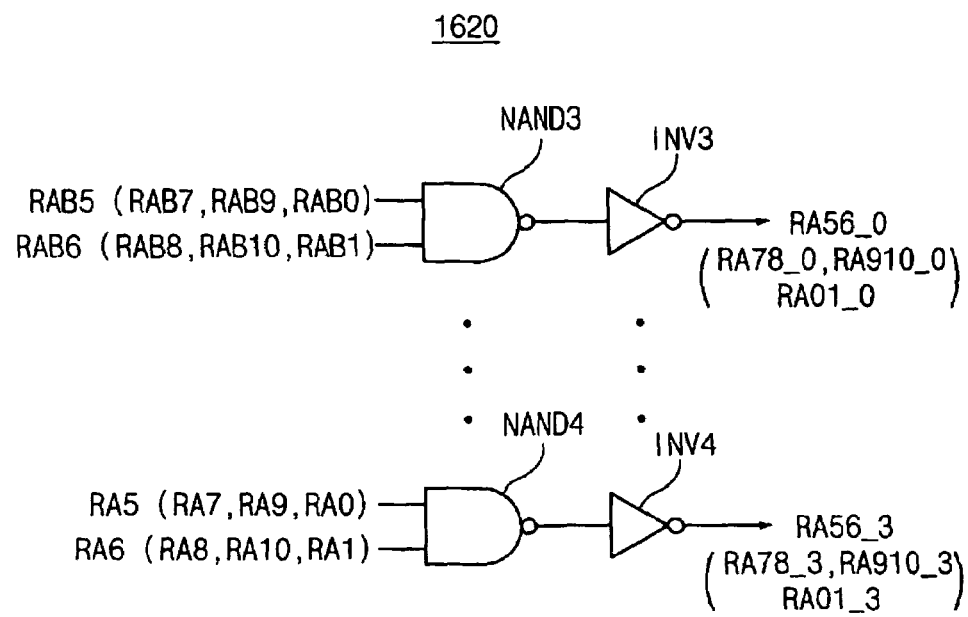

FIGS. 10 and 11 are schematic views illustrating pre-decoders of the word line control signal generating circuit 1000 of FIG. 9 according to another example embodiment of the present invention.

In the example embodiment of FIG. 10, the pre-decoder 1610 may perform logical operations (e.g., a NAND operation followed by an inversion operation) on the row address signals RA/RAB2-4 to generate pre-decoded row address signals RA234_0-RA234_7.

In the example embodiment of FIG. 11, the pre-decoder 1620 may perform logical operations (e.g., a NAND operation followed by an inversion operation) on the row address signals RA/RAB5-6, RA/RAB7-8, RA/RAB9-10 and RA/RAB0-1 to generate the pre-decoded row address signals RA56_0-RA56_3, RA78_0-RA78_3, RA910_0-RA910_3 and RA01_0-RA01_3.

Figure 12:
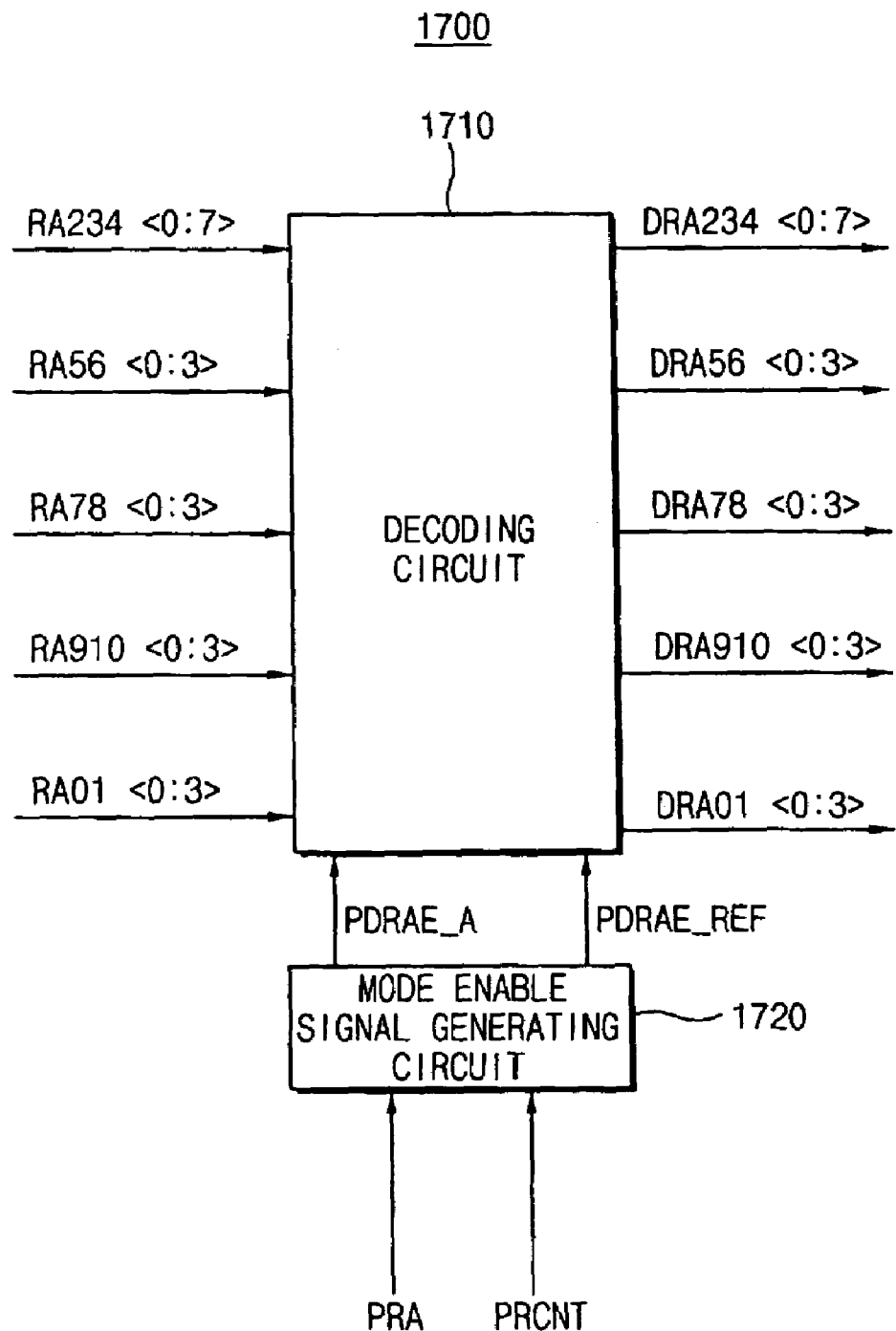
FIG. 12 is a block diagram illustrating an address buffer of the word line control signal generating circuit of FIG. 9 according to another example embodiment of the present invention.

FIG. 12 is a block diagram illustrating the second address buffer 1700 of the word line control signal generating circuit 1000 of FIG. 9 according to another example embodiment of the present invention.

In the example embodiment of FIG. 12, the second address buffer 1700 may include a mode enable signal generating circuit 1720 and a decoding circuit 1710. The mode enable signal generating circuit 1720 may generate an active mode enable signal PDRAE_A and a refresh mode enable signal PDRAE_REF having a given pulse width based on the row address setup signal PRA and the refresh count signal PRCNT. The row address setup signal PRA may be generated based on an external clock signal. The decoding circuit 1710 may latch the pre-decoded row address signals RA234_i, RA56_i, RA78_i, RA910_i, and RA01_i inputted thereto in response to the active mode enable signal PDRAE_A and the refresh mode enable signal PDRAE_REF to generate the coded row address signals DRA234_i, DRA56_i, DRA78_i, DRA910_i and DRA01_i.

Figure 13:
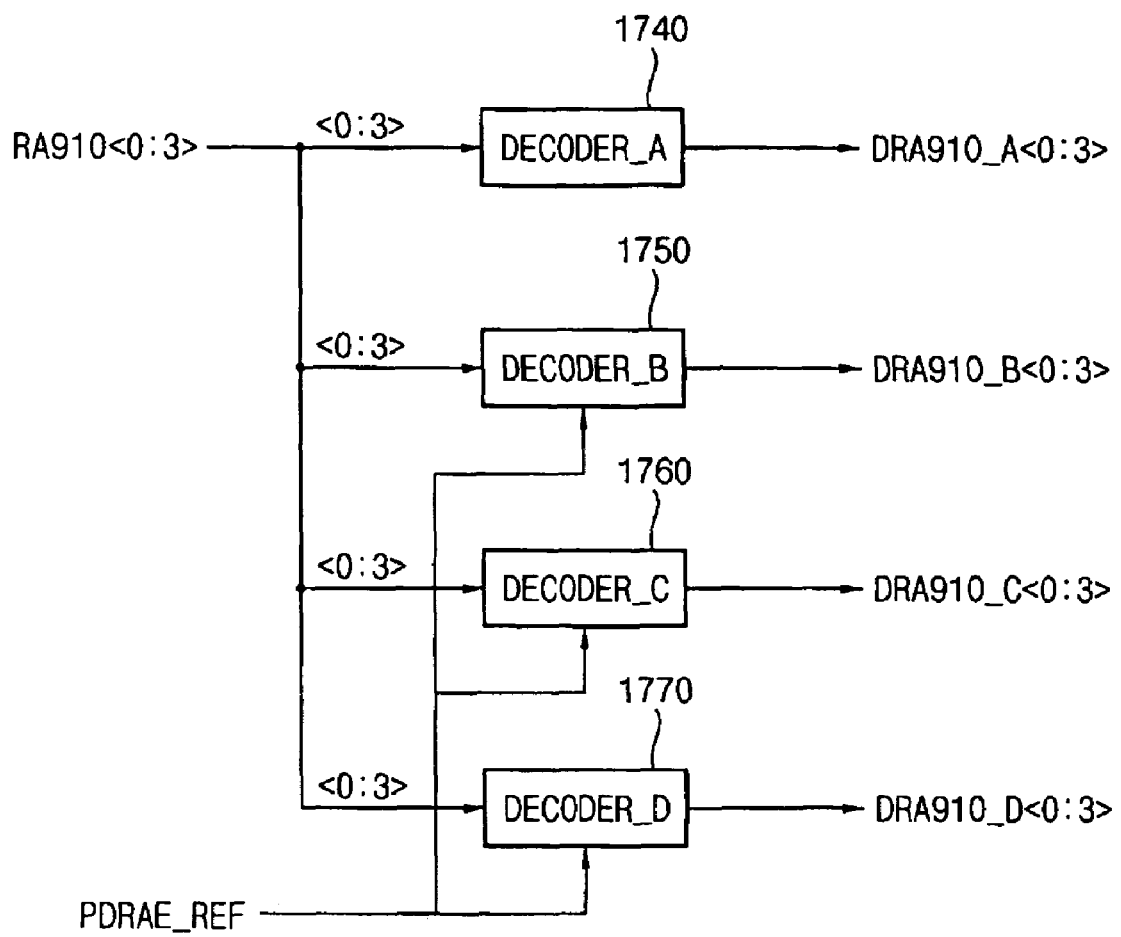
FIG. 13 is a block diagram illustrating a block select decoding circuit according to another example embodiment of the present invention.

FIG. 13 is a block diagram illustrating a block select decoding circuit 1730 according to another example embodiment of the present invention. In an example, the block select decoding circuit 1730 may be included within the decoding circuit 1710 of FIG. 12.

In the example embodiment of FIG. 13, the block select decoding circuit 1730 may include first through fourth decoders 1740, 1450, 1760 and 1770. The first decoder 1740 may select a memory block of the memory bank BANK A, the second decoder 1750 may select a memory block of the memory bank BANK B, the third decoder 1760 may select a memory block of the memory bank BANK C and the fourth decoder 1770 may select a memory block of the memory bank BANK D.

In the example embodiment of FIG. 13, the first decoder 1740 may decode the pre-decoded row address signal RA910<0:3> to generate the decoded row address signal DRA910_A<0:3> for the memory bank BANK A. The second decoder 1750 may decode the pre-decoded row address signal RA910<0:3> to generate the decoded row address signal DRA910_B<0:3> for the memory bank BANK B. The third decoder 1760 may decode the pre-decoded row address signal RA910<0:3> to generate the decoded row address signal DRA910_C<0:3> for the memory bank BANK C. The fourth decoder 1770 may decode the pre-decoded row address signal RA910<0:3> to generate the decoded row address signal DRA910_D<0:3> for the memory bank BANK D.

Figure 14:
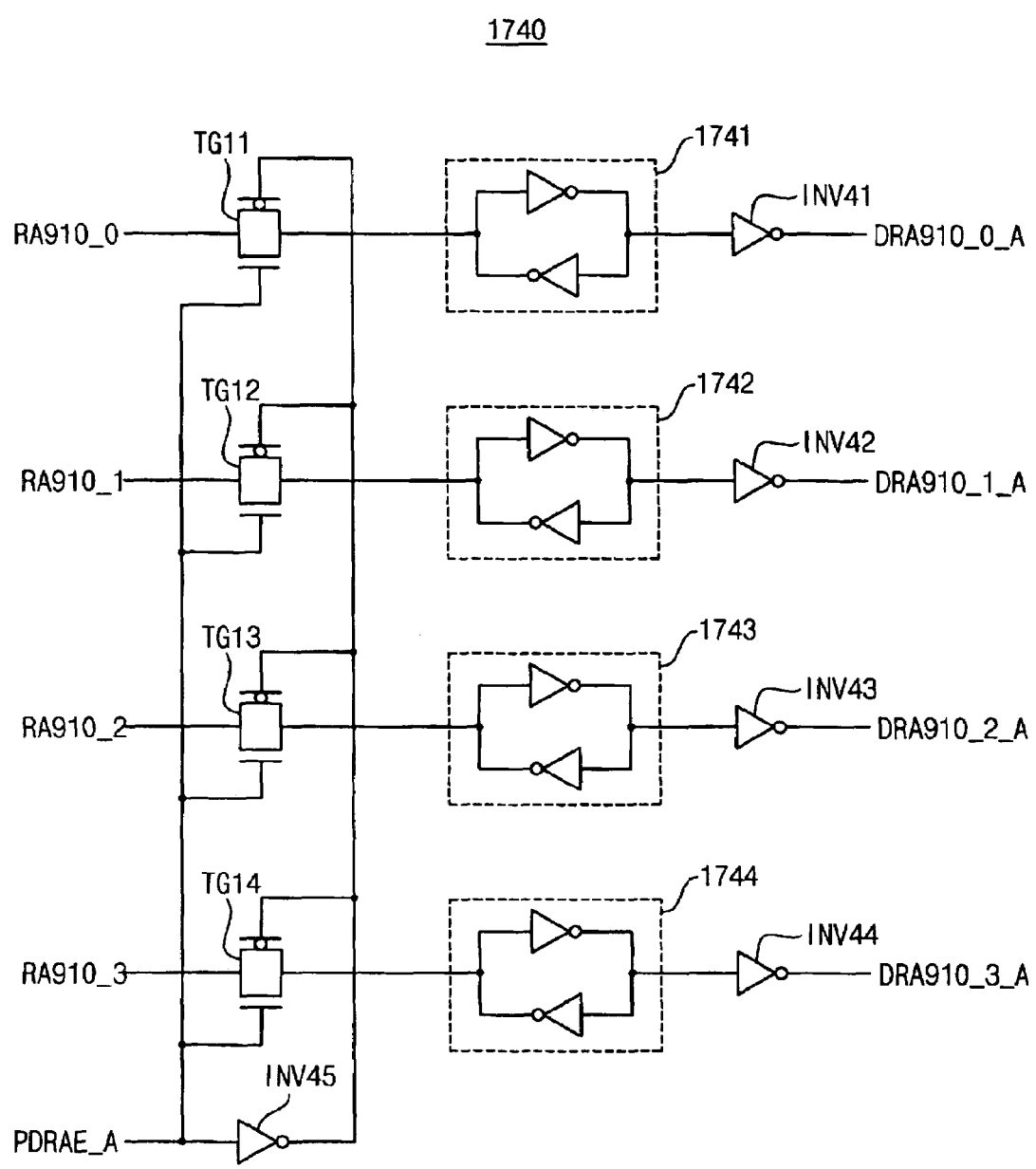
FIG. 14 is a circuit diagram illustrating a first decoder in the block select decoding circuit of FIG. 13 according to another example embodiment of the present invention.

FIG. 14 is a circuit diagram illustrating the first decoder 1740 in the block select decoding circuit 1730 of FIG. 13 according to another example embodiment of the present invention.

In the example embodiment of FIG. 14, the first decoder 1740 may include transmission gates TG11 through TG14, latch circuits 1741 through 1744, and inverters INV41 through INV45. The first decoder 1740 may decode the pre-decoded row address signals RA910<0:3> to generate the decoded row address signals DRA910<0:3> for the memory bank BANK A.

In the example embodiment of FIG. 14, the inverter INV45 may invert the active mode enable signal PDRAE_A. The transmission gate TG11 may output a pre-decoded row address signal RA910_0 in response to the active mode enable signal PDRAE_A. The transmission gate TG12 may output a pre-decoded row address signal RA910_1 in response to the active mode enable signal PDRAE_A. The transmission gate TG13 may output a pre-decoded row address signal RA910_2 in response to the active mode enable signal PDRAE_A. The transmission gate TG14 may output a pre-decoded row address signal RA910_3 in response to the active mode enable signal PDRAE_A.

In the example embodiment of FIG. 14, the latch circuit 1741 may latch an output signal of the transmission gate TG11, the latch circuit 1742 may latch an output signal of the transmission gate TG12, the latch circuit 1743 may latch an output signal of the transmission gate TG13 and the latch circuit 1744 may latch an output signal of the transmission gate TG14.

In the example embodiment of FIG. 14, the inverter INV41 may invert an output signal of the latch circuit 1741 to generate a decoded row address signal DRA910_0_A for the memory bank BANK A. The inverter INV42 may invert an output signal of the latch circuit 1742 to generate a decoded row address signal DRA910_1_A for the memory bank BANK A. The inverter INV43 may invert an output signal of the latch circuit 1743 to generate a decoded row address signal DRA910_2_A for the memory bank BANK A. The inverter INV44 may invert an output signal of the latch circuit 1744 to generate a decoded row address signal DRA910_3_A for the memory bank BANK A.

In the example embodiment of FIG. 14, the first decoder 1740 may operate in an active mode. The first decoder 1740 may decode the pre-decoded row address signals RA910<0:3> to generate pre-decoded row address signals DRA910_A<0:3> for the memory bank BANK A.

Figure 15:
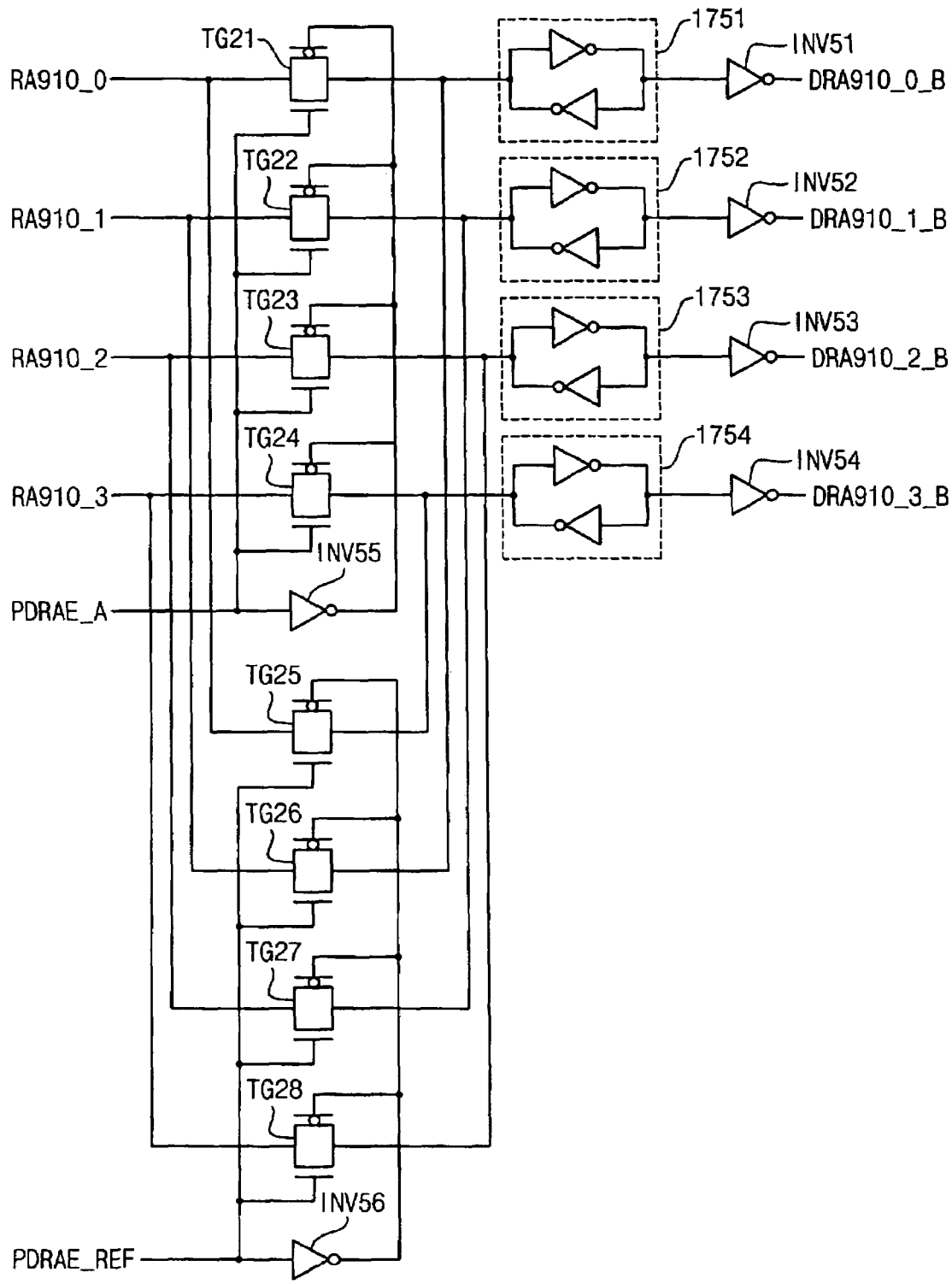
FIG. 15 is a circuit diagram illustrating a second decoder in the block select decoding circuit of FIG. 13 according to another example embodiment of the present invention.

FIG. 15 is a circuit diagram illustrating the second decoder 1750 in the block select decoding circuit 1730 of FIG. 13 according to another example embodiment of the present invention.

In the example embodiment of FIG. 15, the second decoder 1750 may include transmission gates TG21 through TG28; latch circuits 1751 through 1754 and inverters INV51 through INV56. The second decoder 1750 may decode pre-decoded row address signals RA910<0:3> to generate the decoded row address signals DRA910_B<0:3> for the memory bank BANK B. In an example, the transmission gates TG21 through TG24 may be turned on in an active mode and the transmission gates TG25 through TG28 may be turned on in the refresh mode.

In the example embodiment of FIG. 15, the inverter INV55 may invert the active mode enable signal PDRAE_A and the inverter INV56 may invert the refresh mode enable signal PDRAE_REF.

In the example embodiment of FIG. 15, the transmission gate TG21 may output the pre-decoded row address signal RA910_0 in response to the active mode enable signal PDRAE_A. The transmission gate TG22 may output the pre-decoded row address signal RA910_1 in response to the active mode enable signal PDRAE_A. The transmission gate TG23 may output the pre-decoded row address signal RA910_2 in response to the active mode enable signal PDRAE_A. The transmission gate TG24 may output the pre-decoded row address signal RA910_3 in response to the active mode enable signal PDRAE_A.

In the example embodiment of FIG. 15, the transmission gate TG25 may output the pre-decoded row address signal RA910_0 in response to the refresh mode enable signal PDRAE_REF. The transmission gate TG26 may output the pre-decoded row address signal RA910_1 in response to the refresh mode enable signal PDRAE_REF. The transmission gate TG27 may output the pre-decoded row address signal RA910_2 in response to the refresh mode enable signal PDRAE_REF. The transmission gate TG28 may output the pre-decoded row address signal RA910_3 in response to the refresh mode enable signal PDRAE_REF.

In the example embodiment of FIG. 15, an output terminal of the transmission gate TG25 may be coupled to an output terminal of the transmission gate TG24, an output terminal of the transmission gate TG26 may be coupled to an output terminal of the transmission gate TG21, an output terminal of the transmission gate TG27 may be coupled to an output terminal of the transmission gate TG22, and an output terminal of the transmission gate TG28 may be coupled to an output terminal of the transmission gate TG23.

In the example embodiment of FIG. 15, the latch circuit 1751 may latch either an output signal of the transmission gate TG21 or an output signal of the transmission gate TG26, the latch circuit 1752 may latch either an output signal of the transmission gate TG22 or an output signal of the transmission gate TG27, the latch circuit 1753 may latch either an output signal of the transmission gate TG23 or an output signal of the transmission gate TG28 and the latch circuit 1754 may latch either an output signal of the transmission gate TG24 or an output signal of the transmission gate TG25.

In the example embodiment of FIG. 15, the inverter INV51 may invert an output signal of the latch circuit 1751 to generate a decoded row address signal DRA910_0_B for the memory bank BANK B. The inverter INV52 may invert an output signal of the latch circuit 1752 to generate a decoded row address signal DRA910_1_B for the memory bank BANK B. The inverter INV53 may invert an output signal of the latch circuit 1753 to generate a decoded row address signal DRA910_2_B for the memory bank BANK B. The inverter INV54 may invert an output signal of the latch circuit 1754 to generate a decoded row address signal DRA910_3_B for the memory bank BANK B.

Hereinafter, example operation of the second decoder 1750 in FIG. 15 will be described in greater detail.

In example operation of the second decoder 1750 of FIG. 15, in the active mode, the second decoder 1750 may decode the pre-decoded row address signals RA910<0:3> received through the transmission gates TG21 through TG24 to generate pre-decoded row address signals DRA910_B<0:3> for the memory bank BANK B.

In example operation of the second decoder 1750 of FIG. 15, in the refresh mode, the second decoder 1750 may decode the pre-decoded row address signals RA910<0:3> received through the transmission gates TG25 through TG28 to generate pre-decoded row address signals DRA910_B<0:3> for the memory bank BANK B.

In example operation of the second decoder 1750 of FIG. 15, in the refresh mode, the pre-decoded row address signal RA910_0 outputted through the transmission gate TG25 may be decoded and outputted as the decoded row address signal DRA910_3_B. The pre-decoded row address signal RA910_1 outputted through the transmission gate TG26 may be decoded and outputted as the decoded row address signal DRA910_0_B. The pre-decoded row address signal RA910_2 outputted through the transmission gate TG27 may be decoded and outputted as the decoded row address signal DRA910_1_B. The pre-decoded row address signal RA910_3 outputted through the transmission gate TG28 may be decoded and outputted as the decoded row address signal DRA910_2_B.

Figure 16:
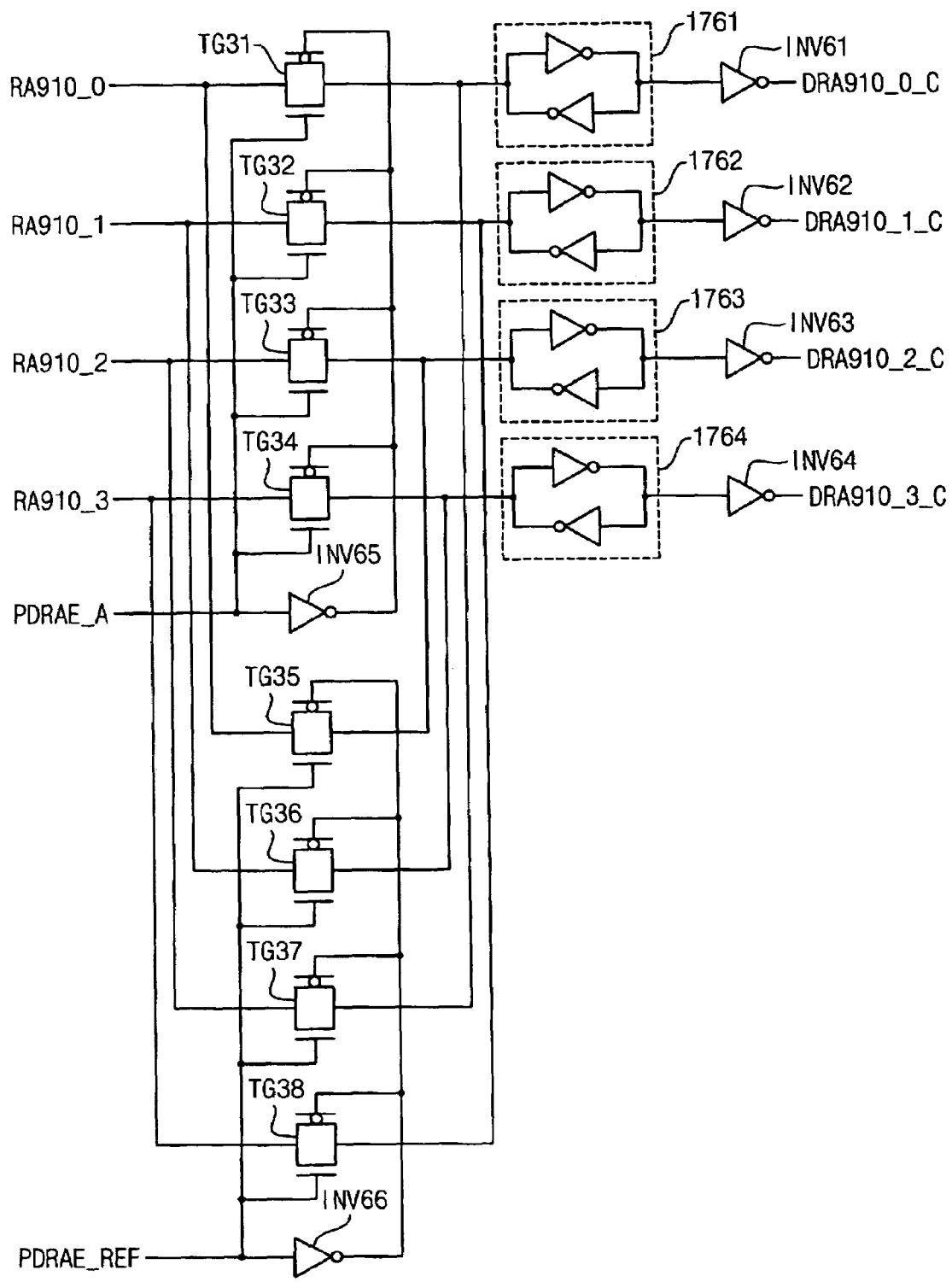
FIG. 16 is a circuit diagram illustrating a third decoder in the block select decoding circuit of FIG. 13 according to another example embodiment of the present invention.

FIG. 16 is a circuit diagram illustrating the third decoder 1760 in the block select decoding circuit 1730 of FIG. 13 according to another example embodiment of the present invention.

In the example embodiment of FIG. 16, the third decoder 1760 may include transmission gates TG31 through TG38, latch circuits 1761 through 1764, and inverters INV61 through INV66. The third decoder 1760 may decode pre-decoded row address signals RA910<0:3> to generate the decoded row address signals DRA910_C<0:3> for the memory bank BANK C. In an example, the transmission gates TG31 through TG34 may be turned on in the active mode and the transmission gates TG35 through TG38 may be turned on in the refresh mode.

In the example embodiment of FIG. 16, the inverter INV65 may invert the active mode enable signal PDRAE_A and the inverter INV66 may invert the refresh mode enable signal PDRAE_REF.

In the example embodiment of FIG. 16, the transmission gate TG31 may output the pre-decoded row address signal RA910_0 based on the active mode enable signal PDRAE_A. The transmission gate TG32 may output the pre-decoded row address signal RA910_1 based on the active mode enable signal PDRAE_A. The transmission gate TG33 may output the pre-decoded row address signal RA910_2 based on the active mode enable signal PDRAE_A. The transmission gate TG34 may output the pre-decoded row address signal RA910_3 based on the active mode enable signal PDRAE_A.

In the example embodiment of FIG. 16, the transmission gate TG35 may output the pre-decoded row address signal RA910_0 based on the refresh mode enable signal PDRAE_REF. The transmission gate TG36 may output the pre-decoded row address signal RA910_1 based on the refresh mode enable signal PDRAE_REF. The transmission gate TG37 may output the pre-decoded row address signal RA910_2 based on the refresh mode enable signal PDRAE_REF. The transmission gate TG38 may output the pre-decoded row address signal RA910_3 based on the refresh mode enable signal PDRAE_REF.

In the example embodiment of FIG. 16, an output terminal of the transmission gate TG35 may be coupled to an output terminal of the transmission gate TG33, an output terminal of the transmission gate TG36 may be coupled to an output terminal of the transmission gate TG34, an output terminal of the transmission gate TG37 may be coupled to an output terminal of the transmission gate TG31, and an output terminal of the transmission gate TG38 may be coupled to an output terminal of the transmission gate TG32.

In the example embodiment of FIG. 16, the latch circuit 1761 may latch an output signal of the transmission gate TG31 or an output signal of the transmission gate TG37, the latch circuit 1762 may latch an output signal of the transmission gate TG32 or an output signal of the transmission gate TG38, the latch circuit 1763 may latch an output signal of the transmission gate TG33 or an output signal of the transmission gate TG35, and the latch circuit 1764 may latch an output signal of the transmission gate TG34 or an output signal of the transmission gate TG36.

In the example embodiment of FIG. 16, the inverter INV61 may invert an output signal of the latch circuit 1761 to generate a decoded row address signal DRA910_0_C for the memory bank BANK C. The inverter INV62 may invert an output signal of the latch circuit 1762 to generate a decoded row address signal DRA910_1_C for the memory bank BANK C. The inverter INV63 may invert an output signal of the latch circuit 1763 to generate a decoded row address signal DRA910_2_C for the memory bank BANK C. The inverter INV64 may invert an output signal of the latch circuit 1764 to generate a decoded row address signal DRA910_3_C for the memory bank BANK C.

An example operation of the third decoder 1760 of FIG. 16 will now be described in greater detail In example operation of the third decoder 1760 of FIG. 16, in the active mode, the third decoder 1760 may decode the pre-decoded row address signals RA910<0:3> inputted through the transmission gates TG31 through TG34 to generate pre-decoded row address signals DRA910_C<0:3> for the memory bank BANK C.

In example operation of the third decoder 1760 of FIG. 16, in the refresh mode, the third decoder 1760 may decode the pre-decoded row address signals RA910<0:3> inputted through the transmission gates TG35 through TG38 to generate pre-decoded row address signals DRA910_C<0:3> for the memory bank BANK C.

In example operation of the third decoder 1760 of FIG. 16, in the refresh mode, the pre-decoded row address signal RA910_0 outputted through the transmission gate TG35 may be decoded and outputted as the decoded row address signal DRA910_2_C. The pre-decoded row address signal RA910_1 outputted through the transmission gate TG36 may be decoded and outputted as the decoded row address signal DRA910_3_C. The pre-decoded row address signal RA910_2 outputted through the transmission gate TG37 may be decoded and outputted as the decoded row address signal DRA910_0_C. The pre-decoded row address signal RA910_3 outputted through the transmission gate TG38 may be decoded and outputted as the decoded row address signal DRA910_1_C.

Figure 17:
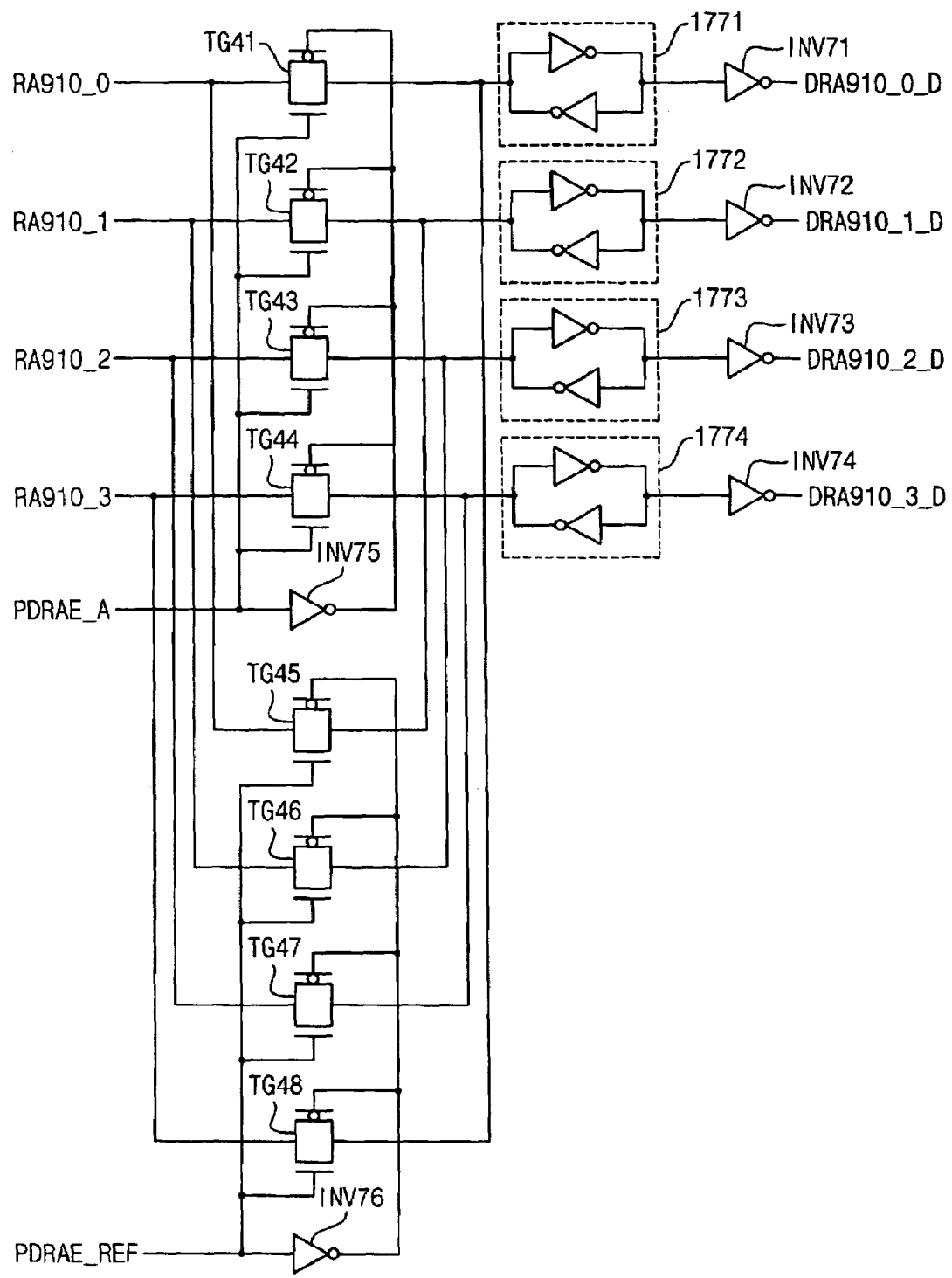
FIG. 17 is a circuit diagram illustrating a fourth decoder in the block select decoding circuit of FIG. 13 according to another example embodiment of the present invention.

FIG. 17 is a circuit diagram illustrating the fourth decoder 1770 in the block select decoding circuit 1730 of FIG. 13 according to another example embodiment of the present invention. In the example embodiment of FIG. 17, the fourth decoder 1770 may include transmission gates TG41 through TG48, latch circuits 1771 through 1774, and inverters INV71 through INV76. The fourth decoder 1770 may decode pre-decoded row address signals RA910<0:3> to generate the decoded row address signals DRA910_D<0:3> for the memory bank BANK D. In an example, the transmission gates TG41 through TG44 may be turned on in the active mode and the transmission gates TG45 through TG48 may be turned on in the refresh mode.

In the example embodiment of FIG. 17, the inverter INV75 may invert the active mode enable signal PDRAE_A and the inverter INV76 may invert the refresh mode enable signal PDRAE_REF. The transmission gate TG41 may output the pre-decoded row address signal RA910_0 in response to the active mode enable signal PDRAE_A. The transmission gate TG42 may output the pre-decoded row address signal RA910_1 in response to the active mode enable signal PDRAE_A. The transmission gate TG43 may output the pre-decoded row address signal RA910_2 in response to the active mode enable signal PDRAE_A. The transmission gate TG44 may output the pre-decoded row address signal RA910_3 in response to the active mode enable signal PDRAE_A.

In the example embodiment of FIG. 17, the transmission gate TG45 may output the pre-decoded row address signal RA910_1 in response to the refresh mode enable signal PDRAE_REF. The transmission gate TG46 may output the pre-decoded row address signal RA910_2 in response to the refresh mode enable signal PDRAE_REF. The transmission gate TG47 may output the pre-decoded row address signal RA910_3 in response to the refresh mode enable signal PDRAE_REF. The transmission gate TG48 may output the pre-decoded row address signal RA910_0 in response to the refresh mode enable signal PDRAE_REF.

In the example embodiment of FIG. 17, an output terminal of the transmission gate TG45 may be coupled to an output terminal of the transmission gate TG42, an output terminal of the transmission gate TG46 may be coupled to an output terminal of the transmission gate TG43, an output terminal of the transmission gate TG47 may be coupled to an output terminal of the transmission gate TG44, and an output terminal of the transmission gate TG48 may be coupled to an output terminal of the transmission gate TG41.

In the example embodiment of FIG. 17, the latch circuit 1771 may latch either an output signal of the transmission gate TG41 or an output signal of the transmission gate TG48, the latch circuit 1772 may latch either an output signal of the transmission gate TG42 or an output signal of the transmission gate TG45, the latch circuit 1773 may latch either an output signal of the transmission gate TG43 or an output signal of the transmission gate TG46 and the latch circuit 1774 may latch either an output signal of the transmission gate TG44 or an output signal of the transmission gate TG47.

In the example embodiment of FIG. 17, the inverter INV71 may invert an output signal of the latch circuit 1771 to generate a decoded row address signal DRA910_0_D for the memory bank BANK D. The inverter INV72 may invert an output signal of the latch circuit 1772 to generate a decoded row address signal DRA910_1_D for the memory bank BANK D. The inverter INV73 may invert an output signal of the latch circuit 1773 to generate a decoded row address signal DRA910_2_D for the memory bank BANK D. The inverter INV74 may invert an output signal of the latch circuit 1774 to generate a decoded row address signal DRA910_3_D for the memory bank BANK D.

Hereinafter, an example operation of the fourth decoder 1770 in FIG. 17 will be described in greater detail.

In example operation of the fourth decoder 1770 of FIG. 17, in the active mode, the fourth decoder 1770 may decode the pre-decoded row address signals RA910<0:3> received through the transmission gates TG41 through TG44 to generate pre-decoded row address signals DRA910_D<0:3> for the memory bank BANK D.

In example operation of the fourth decoder 1770 of FIG. 17, in the refresh mode, the fourth decoder 1770 may decode the pre-decoded row address signals RA910<0:3> received through the transmission gates TG45 through TG48 to generate pre-decoded row address signals DRA910_D<0:3> for the memory bank BANK D.

In example operation of the fourth decoder 1770 of FIG. 17, in the refresh mode, the pre-decoded row address signal RA910_0 outputted through the transmission gate TG45 may be decoded and outputted as the decoded row address signal DRA910_1_D. The pre-decoded row address signal RA910_1 outputted through the transmission gate TG46 may be decoded and outputted as the decoded row address signal DRA910_2_D. The pre-decoded row address signal RA910_2 outputted through the transmission gate TG47 may be decoded and outputted as the decoded row address signal DRA910_3_D. The pre-decoded row address signal RA910_3 outputted through the transmission gate TG48 may be decoded and outputted as the decoded row address signal DRA910_0_D.

FIG. 18 is a block diagram illustrating the pre-decoder 1640 and the second address buffer 1700 of FIG. 9 according to another example embodiment of the present invention.

In the example embodiment of FIG. 18, the memory blocks (e.g., normal memory blocks and/or edge memory blocks) may be activated as illustrated in the example embodiment of FIG. 8 by using the decoded row address signals DRA910_A<0:3>, DRA910_B<0:3>, DRA910_C<0:3> and DRA910_D<0:3> that may be generated with the circuit configuration shown in FIG. 18. In an example, the pre-decoded 1640 may be a block select pre-decoder that controls the second address buffer 1700 to generate a block select signal DRA910_I for selecting a memory block.

In the example embodiment of FIG. 18, the pre-decoder 1640 may include first through fourth pre-decoders 1641 through 1644, inverters 1645, 1647, 1648 and 1649, and an XOR gate 1646. The inverters 1645 and 1648 may invert a first refresh count signal CNT9 and the inverter 1647 may invert a second refresh count signal CNT10. The inverter 1649 may invert an output signal B_CNT10 of the XOR gate 1646. In an example, the first and second refresh count signals CNT9 and CNT10 may be generated by a refresh counter (not shown).

In the example embodiment of FIG. 18, the first pre-decoder 1641 may generate the pre-decoded row address signal RA910<0:3> based on the first and second refresh count signals CNT9 and CNT10 and row address signals RA9 and RA10. The second pre-decoder 1642 may generate the pre-decoded row address signal RA910_REF_B<0:3> for the memory bank BANK B based on an output signal B_CNT9 of the inverter 1645 and the output signal B_CNT10 of the XOR gate 1646. The third pre-decoder 1643 may generate the pre-decoded row address signal RA910_REF_C<0:3> for the memory bank BANK C based on the first refresh count signal CNT9 and an output signal C_CNT10 of the inverter 1647. The fourth pre-decoded 1644 may generate the pre-decoded row address signal RA910_REF_D<0:3> for the memory bank BANK D based on an output signal D_CNT9 of the inverter 1648 and an output signal D_CNT10 of the inverter 1649.

In the example embodiment of FIG. 18, a decoder 1810 may decode the pre-decoded row address signal RA910<0:3> outputted from the first pre-decoder 1641 to generate a decoded row address signal DRA910_A<0:3>, a decoder 1820 may decode the pre-decoded row address signal RA910_REF_B<0:3> outputted from the second pre-decoder 1642 to generate a decoded row address signal DRA910_B<0:3>, a decoder 1830 may decode the pre-decoded row address signal RA910_REF_C<0:3> outputted from the third pre-decoder 1643 to generate a decoded row address signal DRA910_C<0:3>, and a decoder 1840 may decode the pre-decoded row address signal RA910_REF_D<0:3> outputted from the fourth pre-decoded 1644 to generate a decoded row address signal DRA910_D<0:3>.

In example embodiments of the present invention as described above, a number of memory blocks (e.g., edge blocks) that are concurrently activated may be decreased. Therefore, a voltage required to enable a word line may be reduced and noise may likewise be reduced. In addition, a power consumption of a semiconductor memory device may be reduced.

Example embodiments of the present invention being thus described, it will be obvious that the same may be varied in many ways. For example, while above-described example embodiments of the present invention are described with respect to particular numbers of bit lengths, memory bank numbers, etc., it is understood that such numbers are given for example purposes only, and other example embodiments of the present invention may include any number of memory blocks, memory banks, etc., with addresses, storage and control signals having any number of bits.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device, comprising,
a plurality of memory banks, each of the plurality of memory banks including a plurality of memory blocks, the plurality of memory blocks arranged in a different addressable order in each of the plurality of memory banks such that memory blocks in corresponding positions of different memory banks do not have the same address, wherein
each of the plurality of memory banks includes at least one edge memory block and at least one normal memory block among the plurality of memory blocks, and
wherein if two edge memory blocks are activated in a given one of the plurality of memory banks, a normal memory block is activated in at least one of the plurality of memory banks other than the given one memory bank.

2. The semiconductor memory device of claim 1, wherein, if the two edge memory blocks are activated in the given one memory bank, a normal memory block is activated in all of the plurality of memory banks other than the given one memory bank.

3. The semiconductor memory device of claim 1, wherein the plurality of memory banks includes a first memory bank, a second memory bank, a third memory bank and a fourth memory bank.

4. The semiconductor memory device of claim 3, wherein the first memory bank includes a first plurality of memory blocks with a first addressable order of 0, 1, 2, . . . , N−1 and N, the second memory bank includes a second plurality of memory blocks with a second addressable order of 2, 3, 4, . . . , 0 and 1, the third memory bank includes a third plurality of memory blocks with a third addressable order of 4, 5, 6, . . . , 2 and 3, and the fourth memory bank includes a fourth plurality of memory blocks with a fourth addressable order of 6, 7, 8, . . . , 4 and 5.

5. The semiconductor memory device of claim 1, wherein the memory banks are divided into a plurality of memory bank groups.

6. The semiconductor memory device of claim 5, wherein the memory bank groups include a first memory bank group, a second memory bank group, a third memory bank group and a fourth memory bank group.

7. The semiconductor memory device of claim 5 wherein each of the plurality of memory groups includes multiple memory banks with multiple memory blocks arranged such that each of the multiple memory blocks within each of the multiple memory banks within each of the plurality of memory groups has a different addressable order.

8. The semiconductor memory device of claim 1, wherein the at least one edge memory block included in each of the plurality of memory banks is at least two edge memory blocks, the at least two edge memory blocks having different addressable orders in different memory banks from among the plurality of memory banks, the at least two edge memory blocks for each memory bank being positioned on different edges of the memory bank and the at least one normal memory block for each memory bank not being positioned on an edge of the memory bank.

9. A method of activating a word line of a semiconductor memory device including a plurality of memory banks, each of the plurality of memory banks including a plurality of memory blocks, each of the plurality of memory blocks including at least one edge memory block and at least one normal memory block, comprising, assigning different addresses to corresponding memory blocks in different memory banks, the addresses being assigned to each memory block based on which memory bank includes the memory block, wherein if two edge memory blocks are activated in a given one of the plurality of memory banks, a normal memory block is activated in at least one of the plurality of memory banks other than the given one memory bank.

10. The method of claim 9, wherein, if the two edge memory blocks are activated in the given one bank, a normal memory block is activated all of the plurality of memory banks other than the given one memory bank.

11. A semiconductor memory device, comprising:

a plurality of memory banks, each of the memory banks having a plurality of memory blocks, wherein if two edge memory blocks are activated in a given one of the plurality of memory banks, at least one normal memory block is activated in each of the plurality of memory banks other than the given one memory bank, the two edge memory blocks being positioned on different edges of the given one memory bank and each of the at least one memory blocks not being positioned on an edge of the plurality of memory banks other than the given one memory bank.

12. The semiconductor memory device of claim 11, wherein the plurality of memory banks includes a first memory bank, a second memory bank, a third memory bank and a fourth memory bank, each of the first through fourth memory banks having first through N+1-th memory blocks where N is an integer.

13. The semiconductor memory device of claim 12, wherein, if the first and N+1-th memory blocks are activated in the first memory bank, the K-th memory block is activated in the second memory bank, the 2K-th memory block is activated in the third memory bank, and the 3K-th memory block is activated in the fourth memory bank where K is an integer equal to or greater than 5.

14. The semiconductor memory device of claim 13, wherein the first and N+1-th memory blocks correspond to edge memory blocks and the second through N-th memory blocks correspond to normal memory blocks.

15. A block select decoding circuit, comprising:

a plurality of decoders, each of the plurality of decoders configured to decode pre-decoded row address signals in response to an active mode enable signal to generate decoded row address signals for an associated memory bank, each of the plurality of decoders associated with a different memory bank, wherein the plurality of decoders includes:

a first decoder, from among the plurality of decoders, the first decoder being configured to decode pre-decoded row address signals in response to the active mode enable signal to generate first decoded row address signals for a first memory bank, and wherein each of the remaining decoders, from among the plurality of decoders, is configured to decode the pre-decoded row address signals in response to the active mode enable signal and a refresh mode enable signal to generate second decoded row address signals for a corresponding second memory bank.

16. The block select decoding circuit of claim 15, wherein the remaining decoders includes:

a second decoder configured to decode the pre-decoded row address signals in response to the active mode enable signal and a refresh mode enable signal to generate second decoded row address signals for a second memory bank;

a third decoder configured to decode the pre-decoded row address signals in response to the active mode enable signal and the refresh mode enable signal to generate third decoded row address signals for a third memory bank; and a fourth decoder configured to decode a pre-decoded row address signals in response to the active mode enable signal and the refresh mode enable signal to generate fourth decoded row address signals for the fourth memory bank.

17. The block select decoding circuit of claim 16, wherein the first through fourth decoded row address signals are different from one another in a refresh mode.

18. A semiconductor memory device, comprising:

the plurality of memory banks; and the block select decoding circuit of claim 15.

19. A block select decoding circuit, comprising:

a pre-decoder circuit configured to generate a pre-decoded row address signal for each of a plurality of memory banks in response to a row address signal, a first refresh count signal and a second refresh count signal, the row address signal including block select information, each of the row address signals for respective members of the plurality of memory banks being different from one another; and a decoder circuit configured to decode the row address signals to generate a plurality of decoded row address signals, each of the decoded row address signals for the respective members of the plurality of memory banks being different from one another.

20. The block select decoding circuit of claim 19, wherein the pre-decoder circuit includes:

a first inverter configured to invert the first refresh count signal;

a second inverter configured to invert the second refresh count signal;

an XOR gate configured to perform an XOR operation on the first and second refresh count signals;

a third inverter configured to invert an output signal of the XOR gate;

a first pre-decoder configured to generate a first row address signal for a first memory bank in response to the row address signal, the first refresh count signal and the second refresh count signal;

a second pre-decoder configured to generate a second row address signal for a second memory bank in response to an output signal of the first inverter and the output signal of the XOR gate;

a third pre-decoder configured to generate a third row address signal for the third memory bank in response to the first refresh count signal and an output signal of the second inverter; and a fourth pre-decoder configured to generate a fourth row address signal for the fourth memory bank in response to the output signal of the first inverter and an output signal of the third inverter.

21. The block select decoding circuit of claim 19, wherein the decoder circuit includes:

a first decoder configured to decode first row address signals to generate first decoded row address signals for a first memory bank;

a second decoder configured to decode second row address signals to generate second decoded row address signals for a second memory bank;

a third decoder configured to decode third row address signals to generate third decoded row address signals for a third memory bank; and a fourth decoder configured to decode fourth pre-decoded row address signals to generate fourth decoded row address signals for the fourth memory bank.

22. A semiconductor memory device, comprising:

the plurality of memory banks; and the block select decoding circuit of claim 19.

23. A semiconductor memory device performing the method of claim 9.

24. A semiconductor memory device including a block select decoding circuit performing the method of claim 9.

* * * * *